US012603948B2

(12) United States Patent
Nonaka et al.

(10) Patent No.: US 12,603,948 B2
(45) Date of Patent: *Apr. 14, 2026

(54) ANGLE ADJUSTMENT DEVICE, SUPPORT, AND DISPLAY DEVICE

(71) Applicant: Semiconductor Energy Laboratory Co., Ltd., Atsugi (JP)

(72) Inventors: Taiki Nonaka, Atsugi (JP); Kazuhiko Fujita, Hiratsuka (JP); Akio Endo, Atsugi (JP); Yuta Ishikawa, Chofu (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/743,251

(22) Filed: Jun. 14, 2024

(65) Prior Publication Data

US 2024/0329698 A1     Oct. 3, 2024

Related U.S. Application Data

(63) Continuation of application No. 17/790,774, filed as application No. PCT/IB2020/062425 on Dec. 24, 2020, now Pat. No. 12,019,483.

(30) Foreign Application Priority Data

Jan. 10, 2020     (JP) ................................ 2020-002836

(51) Int. Cl.
| | |
|---|---|
| *H04M 1/02* | (2006.01) |
| *G06F 1/16* | (2006.01) |
| *H10K 59/80* | (2023.01) |

(52) U.S. Cl.
CPC .......... *H04M 1/022* (2013.01); *G06F 1/1641* (2013.01); *G06F 1/1652* (2013.01);
(Continued)

(58) Field of Classification Search
CPC .... G06F 1/1681; G06F 1/1641; G06F 1/1652; H04M 1/022; E05D 3/06; E05D 3/12;
(Continued)

(56) References Cited

U.S. PATENT DOCUMENTS

| | | | | | |
|---|---|---|---|---|---|
| 4,995,144 A | * | 2/1991 | Gateley | ..................... | E05D 3/08 |
| | | | | | 16/261 |
| 8,713,759 B2 | * | 5/2014 | Cai | ....................... | G06F 1/1681 |
| | | | | | 16/369 |

(Continued)

FOREIGN PATENT DOCUMENTS

| | | |
|---|---|---|
| CN | 104900153 A | 9/2015 |
| CN | 105549682 A | 5/2016 |

(Continued)

OTHER PUBLICATIONS

International Search Report (Application No. PCT/IB2020/062425) Dated Mar. 23, 2021.

(Continued)

*Primary Examiner* — Jeffrey O'Brien
(74) *Attorney, Agent, or Firm* — Eric J. Robinson; Robinson Intellectual Property Law Office, P.C.

(57)     ABSTRACT

An angle adjustment device capable of being kept at a desired angle is provided. The angle adjustment device can fix and keep the relative positions of the first base component and the second base component, and a support with a combination of the angle adjustment device and components such as a flat plate can keep the entire body in a shape opened on a plane, a folded shape, a shape kept at a desired angle, or the like. In addition, the angle adjustment device can make a bending movement in one direction, which prevents bending in a reverse direction. Therefore, it is possible to prevent an accidental bending movement of an (Continued)

apparatus including the angle adjustment device to prevent breakage or the like of the apparatus.

13 Claims, 25 Drawing Sheets

(52) U.S. Cl.
CPC ......... *G06F 1/1681* (2013.01); *H04M 1/0268* (2013.01); *H10K 59/873* (2023.02)

(58) Field of Classification Search
CPC .... E05D 3/14; E05D 3/16; E05D 3/18; E05D 2003/163; E05D 2003/166
USPC .......................................... 16/368, 369, 227
See application file for complete search history.

(56) References Cited

U.S. PATENT DOCUMENTS

| | | | | |
|---|---|---|---|---|
| 8,720,011 B1 * | 5/2014 | Hsu | | G06F 1/1681 |
| | | | | 16/354 |
| 8,869,352 B2 * | 10/2014 | Hsu | | G06F 1/1681 |
| | | | | 16/354 |
| 8,869,353 B2 * | 10/2014 | Hsu | | E05D 3/14 |
| | | | | 16/366 |
| 8,943,651 B2 * | 2/2015 | Hsu | | H05K 5/0226 |
| | | | | 16/366 |
| 9,173,287 B1 | 10/2015 | Kim et al. | | |
| 9,176,535 B2 * | 11/2015 | Bohn | | G06F 1/1681 |
| 9,557,771 B2 | 1/2017 | Park et al. | | |
| 9,588,549 B2 | 3/2017 | Endo et al. | | |
| 9,625,947 B2 * | 4/2017 | Lee | | G06F 1/1616 |
| 9,841,050 B2 * | 12/2017 | Hsu | | F16C 11/04 |
| 9,857,844 B2 | 1/2018 | Tsukamoto | | |
| 9,891,725 B2 * | 2/2018 | Lindblad | | H10K 59/80 |
| 9,898,051 B2 * | 2/2018 | Cho | | G06F 1/1652 |
| 9,927,841 B2 * | 3/2018 | Gheorghiu | | E05D 11/0054 |
| 9,992,888 B2 * | 6/2018 | Moon | | G06F 1/1618 |
| 10,073,496 B2 * | 9/2018 | Chen | | G06F 1/1681 |
| 10,120,415 B2 | 11/2018 | Seo et al. | | |
| 10,133,303 B2 | 11/2018 | Park et al. | | |
| 10,139,879 B2 | 11/2018 | Yamazaki et al. | | |
| 10,143,098 B1 * | 11/2018 | Lee | | E05D 3/18 |
| 10,178,765 B2 * | 1/2019 | Fan | | G09F 9/301 |
| 10,198,041 B2 * | 2/2019 | Myeong | | G02F 1/133305 |
| 10,244,641 B2 * | 3/2019 | Seo | | G09F 9/301 |
| 10,306,783 B2 * | 5/2019 | Seo | | H05K 5/0226 |
| 10,306,785 B1 | 5/2019 | Chuang et al. | | |
| 10,310,565 B2 * | 6/2019 | Aoki | | G06F 1/1652 |
| 10,310,566 B2 * | 6/2019 | Liao | | H04M 1/02 |
| 10,314,184 B2 * | 6/2019 | Choi | | G06F 1/1616 |
| 10,331,247 B2 * | 6/2019 | Jinbo | | G06F 1/1626 |
| 10,540,026 B2 * | 1/2020 | Park | | G06F 1/1681 |
| 10,627,867 B2 | 4/2020 | Cheng et al. | | |
| 10,694,623 B2 * | 6/2020 | Park | | G09F 9/301 |
| 10,694,624 B2 * | 6/2020 | Rothkopf | | H04M 1/0216 |
| 11,061,436 B2 * | 7/2021 | O'Neil | | G06F 1/1616 |
| 11,132,027 B2 * | 9/2021 | Park | | G06F 1/1616 |
| 11,169,580 B2 * | 11/2021 | Lee | | G09F 9/301 |
| 11,406,026 B2 | 8/2022 | Van Dijk et al. | | |
| 11,477,901 B2 * | 10/2022 | Choi | | G09F 9/301 |
| 11,785,730 B2 * | 10/2023 | Hung | | H04M 1/022 |
| | | | | 361/807 |

| | | | | |
|---|---|---|---|---|
| 12,314,089 B2 * | 5/2025 | Ying | | G06F 1/1681 |
| 2012/0044620 A1 * | 2/2012 | Song | | H04M 1/0216 |
| | | | | 361/679.01 |
| 2012/0120618 A1 * | 5/2012 | Bohn | | H04M 1/022 |
| | | | | 361/679.01 |
| 2014/0126121 A1 * | 5/2014 | Griffin | | G06F 1/1652 |
| | | | | 361/679.01 |
| 2015/0023031 A1 | 1/2015 | Endo | | |
| 2015/0131222 A1 * | 5/2015 | Kauhaniemi | | G06F 1/1681 |
| | | | | 16/225 |
| 2015/0257289 A1 * | 9/2015 | Lee | | H05K 5/0226 |
| | | | | 361/749 |
| 2015/0277506 A1 * | 10/2015 | Cheah | | G06F 1/1632 |
| | | | | 361/679.28 |
| 2016/0062412 A1 | 3/2016 | Park et al. | | |
| 2016/0116944 A1 | 4/2016 | Lee et al. | | |
| 2016/0139634 A1 * | 5/2016 | Cho | | G06F 1/1681 |
| | | | | 16/366 |
| 2016/0195901 A1 * | 7/2016 | Kauhaniemi | | G06F 1/1652 |
| | | | | 361/679.27 |
| 2017/0139442 A1 | 5/2017 | Yoshizumi | | |
| 2017/0208699 A1 | 7/2017 | Mcdermid | | |
| 2018/0039471 A1 | 2/2018 | Yanagisawa et al. | | |
| 2018/0095502 A1 | 4/2018 | Yamazaki et al. | | |
| 2018/0101200 A1 | 4/2018 | Myeong et al. | | |
| 2018/0195329 A1 * | 7/2018 | Alletto | | E05D 3/12 |
| 2018/0196467 A1 | 7/2018 | Watamura et al. | | |
| 2019/0179373 A1 | 6/2019 | Cheng et al. | | |
| 2020/0043382 A1 | 2/2020 | Isa et al. | | |
| 2021/0216103 A1 * | 7/2021 | Chen | | G06F 1/1652 |
| 2021/0216109 A1 * | 7/2021 | Lin | | G06F 1/1652 |
| 2021/0311530 A1 * | 10/2021 | Heiskanen | | H04M 1/022 |
| 2022/0181222 A1 * | 6/2022 | Endo | | H01L 23/13 |
| 2022/0187871 A1 * | 6/2022 | Yamazaki | | G09F 9/00 |
| 2022/0357777 A1 * | 11/2022 | Moon | | H04M 1/0268 |

FOREIGN PATENT DOCUMENTS

| | | |
|---|---|---|
| CN | 105788457 A | 7/2016 |
| CN | 205847346 U | 12/2016 |
| CN | 206377137 U | 8/2017 |
| CN | 107919062 A | 4/2018 |
| CN | 207195430 U | 4/2018 |
| EP | 2421231 A | 2/2012 |
| EP | 3015947 A | 5/2016 |
| EP | 3306596 A | 4/2018 |
| EP | 3467325 A | 4/2019 |
| JP | 2013-243588 A | 12/2013 |
| JP | 2015-130320 A | 7/2015 |
| JP | 2018-060201 A | 4/2018 |
| JP | 2019-091004 A | 6/2019 |
| JP | 2019-520528 | 7/2019 |
| KR | 2012-0016873 A | 2/2012 |
| KR | 2015-0105138 A | 9/2015 |
| KR | 2016-0035146 A | 3/2016 |
| KR | 2016-0049235 A | 5/2016 |
| KR | 2018-0039220 A | 4/2018 |
| KR | 2019-0013992 A | 2/2019 |
| WO | WO-2017/211115 | 12/2017 |

OTHER PUBLICATIONS

Written Opinion (Application No. PCT/IB2020/062425) Dated Mar. 23, 2021.

* cited by examiner 101a,101b 102a,102b

FIG. 7A
FIG. 7B
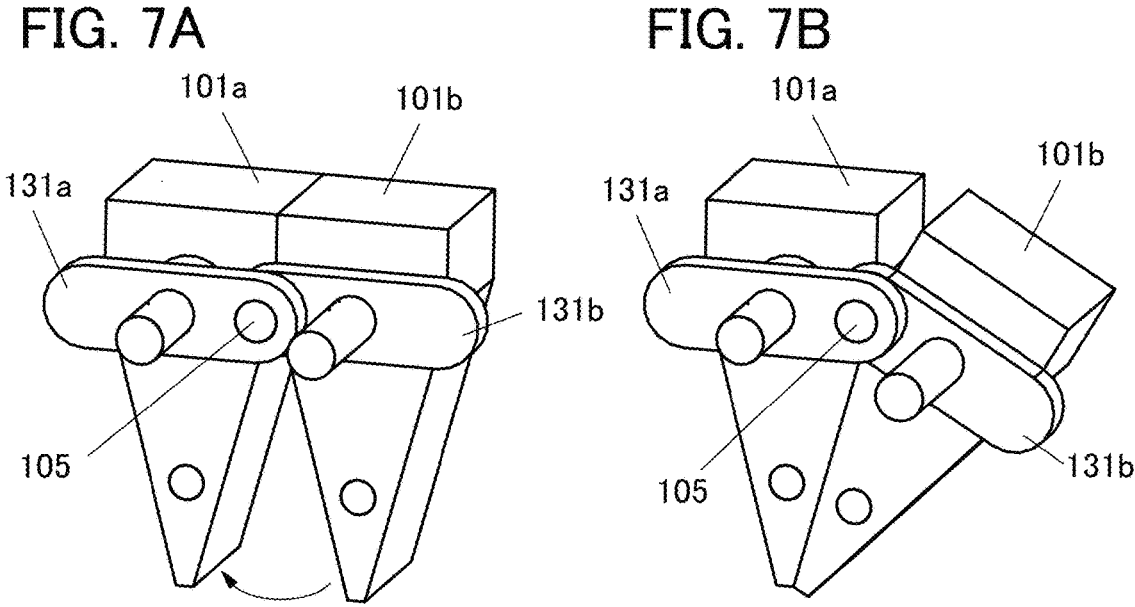
FIG. 7C
FIG. 7D
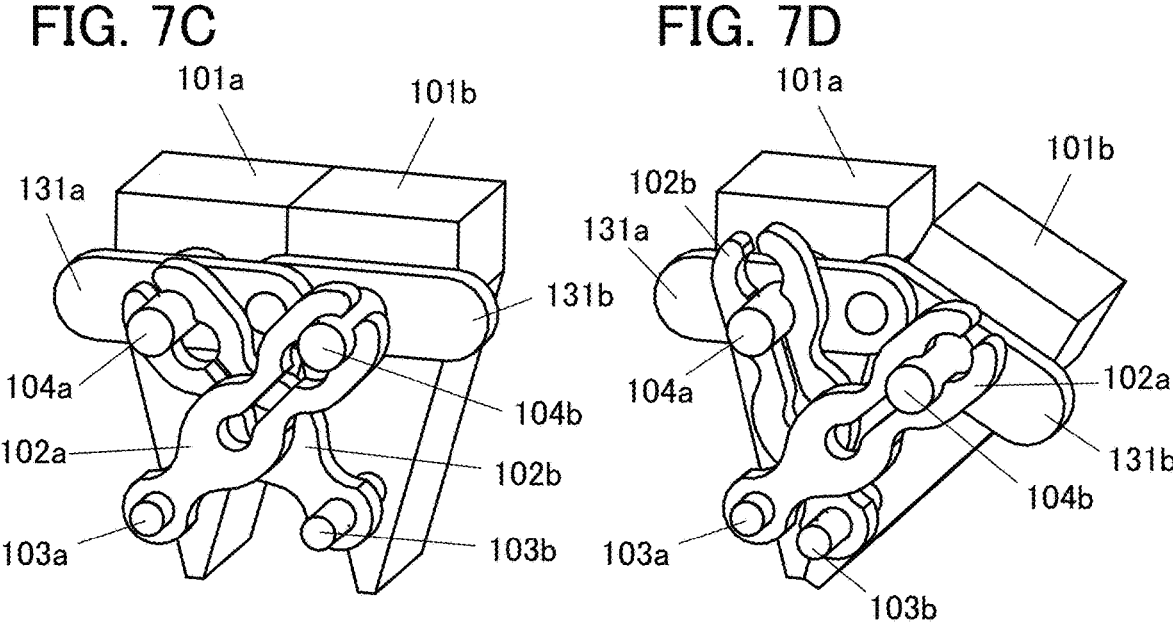

FIG. 19A
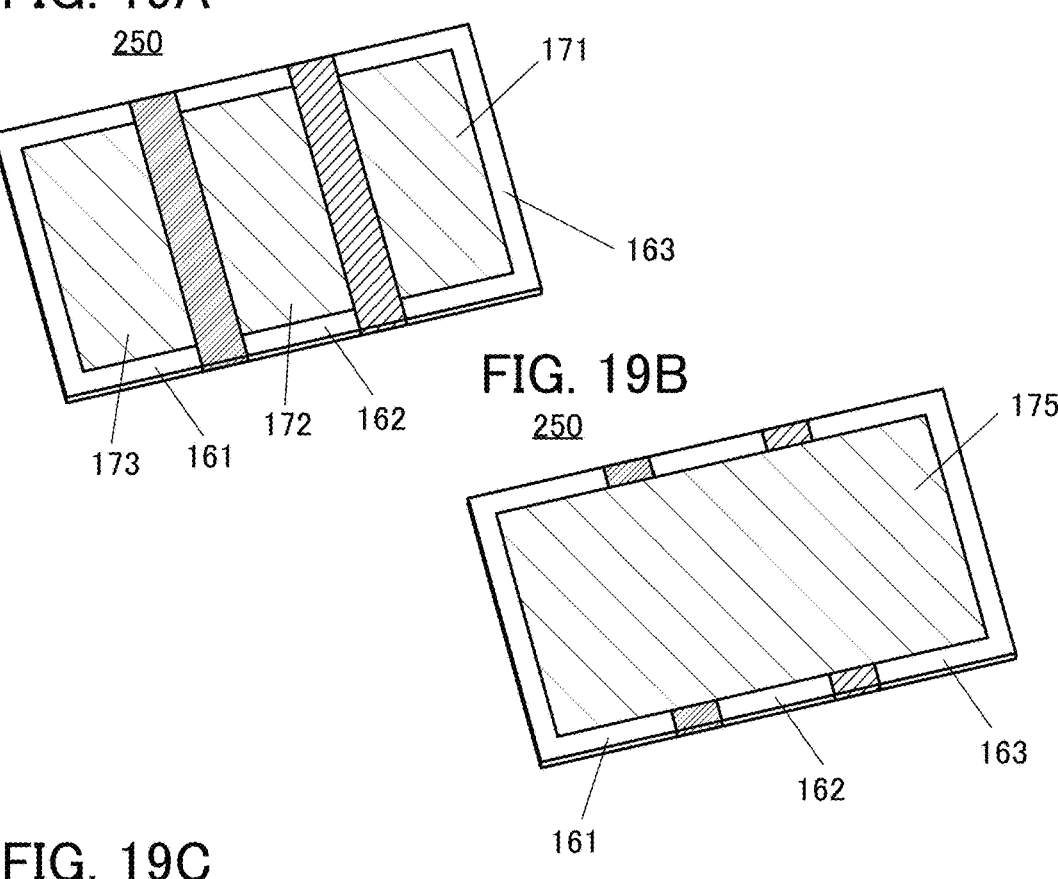
FIG. 19B
FIG. 19C
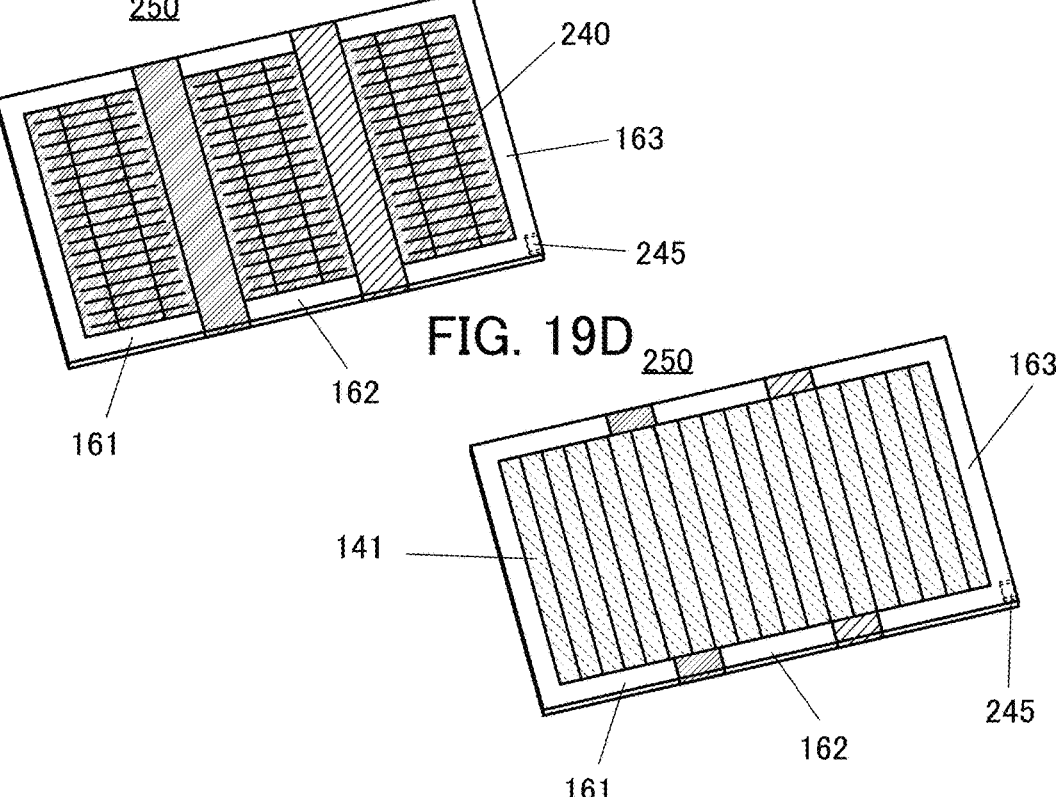
FIG. 19D

FIG. 24A
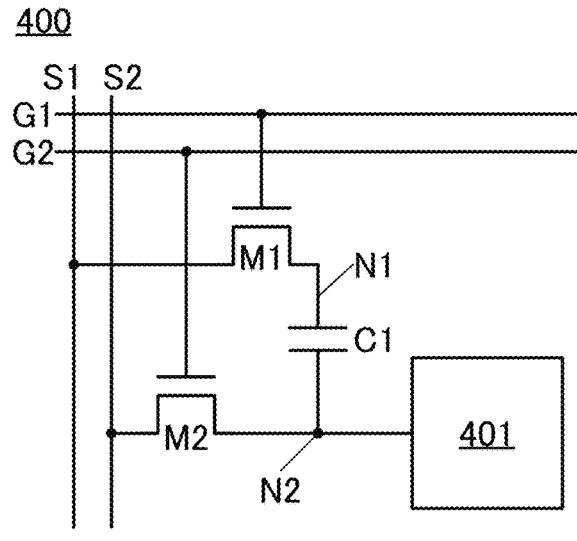
FIG. 24B
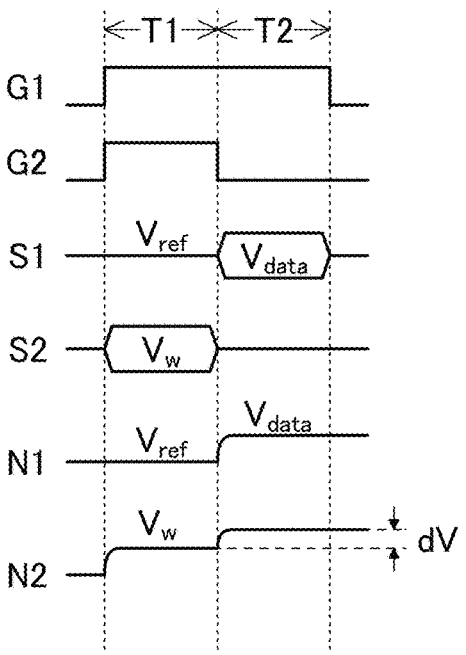
FIG. 24C
FIG. 24D
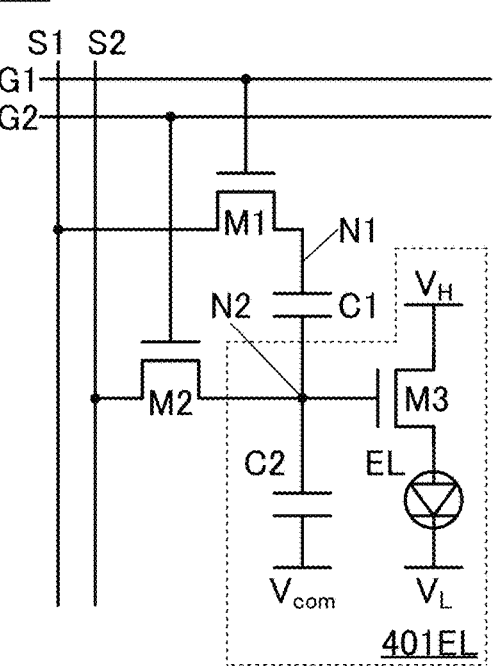

ANGLE ADJUSTMENT DEVICE, SUPPORT, AND DISPLAY DEVICE

TECHNICAL FIELD

The present invention relates to an object, a method, or a manufacturing method. Alternatively, the present invention relates to a process, a machine, manufacture, or a composition of matter. In particular, one embodiment of the present invention relates to a semiconductor device, a light-emitting device, a display device, an electronic device, a lighting device, a driving method thereof, or a manufacturing method thereof. In particular, one embodiment of the present invention relates to an angle adjustment device, a flexible component support, and a display device including the flexible component support.

In this specification and the like, a semiconductor device refers to every device that can function by utilizing semiconductor characteristics. A transistor, a semiconductor circuit, an arithmetic device, a memory device, and the like are each one embodiment of the semiconductor device. Moreover, a light-emitting apparatus, a display device, a lighting device, and an electronic device each include a semiconductor device in some cases.

BACKGROUND ART

Electronic devices such as cellular phones, smartphones, tablet type computers, and laptop computers are fabricated with appropriate sizes depending on their functions, usability, design, portability, and the like. Meanwhile, it is inconvenient to carry a plurality of electronic devices with overlapping functions. Accordingly, a form in which functions of a plurality of electronic devices are integrated is desired. For example, Patent Document 1 discloses a tri-fold light-emitting panel. The use of the light-emitting panel enables integration of functions of a plurality of electronic devices and manufacture of an electronic device whose size is variable.

REFERENCE

Patent Document

[Patent Document 1] Japanese Published Patent Application No. 2015-130320

SUMMARY OF THE INVENTION

Problems to be Solved by the Invention

In a display apparatus with a foldable display portion, at least part of a display panel formed over a flexible substrate is fixed to a support, and a folding movement or the like is made by bending the support. At this time, when the display panel is bent in a direction opposite to design intention of the support, for example, the display panel, a hinge portion included in the support, and the like might be broken; therefore, the display panel is preferably well designed so as not to be easily bent in the reverse direction.

The display apparatus is used with being variously transformed. For example, use in a state of being opened on a plane, in a folded state, in a state of being bent at a desired angle (intermediate state), and in other states is assumed. Therefore, the support is preferably capable of keeping the form regardless of the state.

Thus, an object of one embodiment of the present invention is to provide an angle adjustment device that adjusts a relative angle between components. Another object is to provide an angle adjustment device capable of fixing a relative angle between components to a desired angle. Another object is to provide a support for supporting a flexible component. Another object is to provide a support for making a bending movement without decreasing the reliability of a flexible component. Another object is to provide a novel support for a flexible component. Another object is to provide a novel light-emitting device.

Another object is to provide a folding display device with high portability. Another object is to provide a folding display device with high display visibility. Another object is to provide a folding display device having a power saving function. Another object is to provide a novel display device.

Note that the description of these objects does not preclude the existence of other objects. One embodiment of the present invention does not need to achieve all these objects. In addition, objects other than the above will be apparent from the description of the specification and the like, and objects other than the above can be derived from the description of the specification and the like.

Means for Solving the Problems

One embodiment of the present invention relates to an angle adjustment device capable of being kept at an desired angle, a support including the angle adjustment device, or a display device including the support.

One embodiment of the present invention is an angle adjustment device including a first base component, a second base component, a first joining component, a second joining component, a first columnar component, a second columnar component, a third columnar component, and a fourth columnar component. The first base component and the second base component each include a first region and a second region. The first joining component and the second joining component each include a first opening portion and a notch portion. The first opening portion and the notch portion are provided side by side in a longitudinal direction of each of the first joining component and the second joining component. The first columnar component or the third columnar component is inserted into the first opening portion. The second columnar component or the fourth columnar component is inserted into the notch portion. The first region of the first base component is joined to the second region of the second base component with the first columnar component, the first joining component, and the fourth columnar component. The first region of the second base component is joined to the second region of the first base component with the third columnar component, the second joining component, and the second columnar component.

The first base component and the second base component each include a first surface, a second surface, a third surface, a fourth surface, and a fifth surface. The first surface has the same shape as the second surface. The third surface has the same shape as the fourth surface. The first surface is parallel to the second surface. The first surface is positioned to face the second surface. The third surface is adjacent to the first surface. The fourth surface is adjacent to the second surface. An angle formed by the third surface and the first surface is greater than 180° and less than or equal to 270°. An angle formed by the fourth surface and the second surface is greater than 180° and less than or equal to 270°. An angle formed by the third surface and the fourth surface is greater than 180° and less than 360°. The fifth surface is adjacent to each of the first surface to the fourth surface. The first region and the second region can be provided on the fifth surface.

The first columnar component is inserted into the first opening portion of the first joining component. The second columnar component is inserted into the notch portion of the second joining component. The third columnar component is inserted into the first opening portion of the second joining component. The fourth columnar component is inserted into the notch portion of the first joining component. The major axes of the first columnar component to the fourth columnar component can be parallel to each other.

The first columnar component is fixed to the first region of the first base component. The second columnar component is fixed to the second region of the first base component. The third columnar component is fixed to the first region of the second base component. The fourth columnar component can be fixed to the second region of the second base component.

The first joining component and the second joining component each have elasticity. The shape of the notch portion can be elastically deformed.

The notch portion includes a third region, a fourth region, and a fifth region. The fourth region is positioned between the third region and the fifth region. The fifth region is positioned between the third region and the first opening portion. Top surface shapes of the third region to the fifth region can each include an arc.

The position of the second columnar component is switched from one of the third region and the fourth region of the second joining component to the other of the third region and the fourth region of the second joining component, and the position of the fourth columnar component is switched from one of the third region and the fourth region of the first joining component to the other of the third region and the fourth region of the first joining component, whereby a relative angle between the first base component and the second base component can be switched.

When the second columnar component is in the third region of the second joining component and the third columnar component is in the fourth region of the first joining component, the first surface of the first base component can be in contact with the second surface of the second base component.

When the second columnar component is in the third region of the second joining component and the fourth columnar component is in the third region of the first joining component, the third surface of the first base component can be in contact with the fourth surface of the second base component.

A third joining component, a fourth joining component, and a fifth columnar component are further included. The third joining component and the fourth joining component each include a second opening portion. The third joining component is fixed to the first base component. The fourth joining component is fixed to the second base component. The fifth columnar component is inserted into the second opening portion of the third joining component and the second opening portion of the fourth joining component. The major axis of the fifth columnar component is parallel to each of the major axes of the first columnar component to the fourth columnar component. The fifth columnar component can be positioned in the vicinity of a region where the first base component is in contact with the second base component.

A support for a flexible component can be formed when the angle adjustment device is provided in a hinge portion. A display device can be formed when the support is provided with a flexible display panel.

It is preferable that the display panel include a light-emitting device.

Effect of the Invention

According to one embodiment of the present invention, an angle adjustment device that adjusts a relative angle between components can be provided. An angle adjustment device capable of fixing a relative angle between components to a desired angle can be provided. Alternatively, a support for supporting a flexible component can be provided. Alternatively, a support for making a bending movement without decreasing the reliability of a flexible component can be provided. Alternatively, a novel support for a flexible component can be provided. Alternatively, a novel light-emitting device can be provided.

Alternatively, a folding display device with high portability can be provided. Alternatively, a folding display device with high display visibility can be provided. Alternatively, a folding display device having a power saving function can be provided. Alternatively, a folding display device that is easy to hold can be provided. Alternatively, a novel display device can be provided.

Note that the description of these effects does not preclude the existence of other effects. One embodiment of the present invention does not have to have all of these effects. Other effects will be apparent from and can be derived from the description of the specification, the drawings, the claims, and the like.

BRIEF DESCRIPTION OF THE DRAWINGS

FIG. 7A to FIG. 7D are diagrams illustrating an angle adjustment device.

FIG. 10A and FIG. 10B are diagrams illustrating an angle adjustment device.

FIG. 19A to FIG. 19D are diagrams each illustrating a display device.

FIG. 21 is a diagram illustrating a structure example of the display panel.

FIG. 23B and FIG. 23C are pixel circuit diagrams.

FIG. 24A, FIG. 24C, and FIG. 24D are pixel circuit diagrams. FIG. 24B is a timing chart showing pixel operation.

MODE FOR CARRYING OUT THE INVENTION

Figure 1:
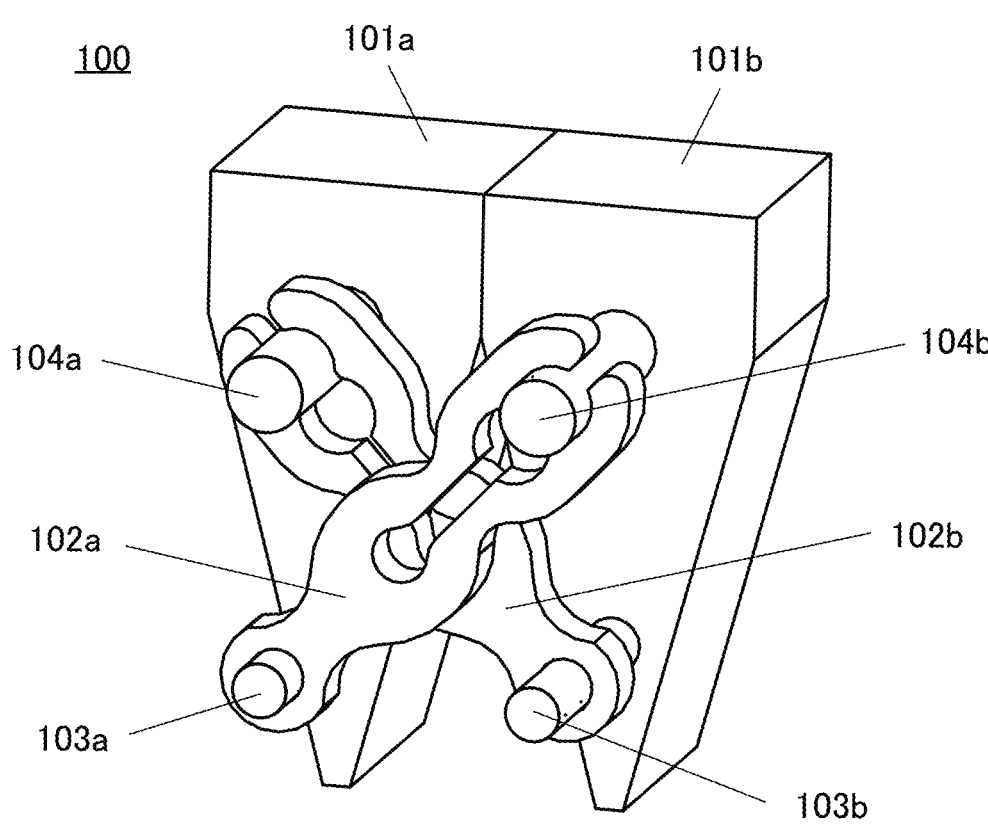
FIG. 1 is a diagram illustrating an angle adjustment device.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same portions or portions having similar functions are denoted by the same reference numerals in different drawings, and the description thereof is not repeated in some cases. Note that the hatching of the same component that constitutes a drawing is sometimes omitted or changed as appropriate in different drawings.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

In addition, one conductor has a plurality of functions such as a wiring, an electrode, and a terminal in some cases. In this specification, a plurality of names are sometimes used for one component. Even in the case where components are illustrated in a circuit diagram as if they were directly connected to each other, the components may actually be connected to each other through one conductor or a plurality of conductors. In this specification, even such a configuration is included in direct connection.

In this specification, a display panel is typically treated as a flexible component; however, the flexible component may be another component. Examples of the flexible component include a solar battery, a primary battery, a secondary battery, an antenna, a charging coil, a speaker, a microphone, a cable, illumination, a variety of terminals, a variety of wirings, a variety of sensors, a variety of circuits, a composite device including any of these, and the like.

In addition, in this specification, a display device generally means a device that has a display function. In other words, an electronic device including a display portion is included in a display device. For example, an electronic device including a display portion, such as a cellular phone, a smartphone, a smartwatch, a tablet type computer, or a television, is included in a display device.

Embodiment 1

In this embodiment, an angle adjustment device, a support, and a display device of embodiments of the present invention will be described with reference to drawings.

One embodiment of the present invention is an angle adjustment device that includes a first base component, a second base component, and a mechanism that switches a relative angle between them. Another embodiment of the present invention is a support that includes the angle adjustment device.

The angle adjustment device can fix and keep the relative positions of the first base component and the second base component. For example, a support with a combination of the angle adjustment device and components such as a flat plate can keep the entire body in a shape opened on a plane, a folded shape, a shape kept at a desired angle, or the like.

In addition, the angle adjustment device can make a bending movement in one direction, which prevents bending in a reverse direction. Therefore, it is possible to prevent an accidental bending movement of an apparatus including the angle adjustment device to prevent breakage or the like of the apparatus.

<Angle Adjustment Device>

FIG. 1A is a diagram illustrating an angle adjustment device 100 of one embodiment of the present invention. The angle adjustment device 100 includes base components 101$a$ and 101$b$, joining components 102$a$ and 102$b$, and columnar components 103$a$, 103$b$, 104$a$, and 104$b$. The base component 101$a$ is joined to the base component 101$b$ with another component. As the columnar components 103$a$, 103$b$, 104$a$, and 104$b$, cylindrical-shaped or polygonal-prism-shaped components can be used; in this embodiment, cylindrical-shaped components are used in an example described below.

Figure 2A:
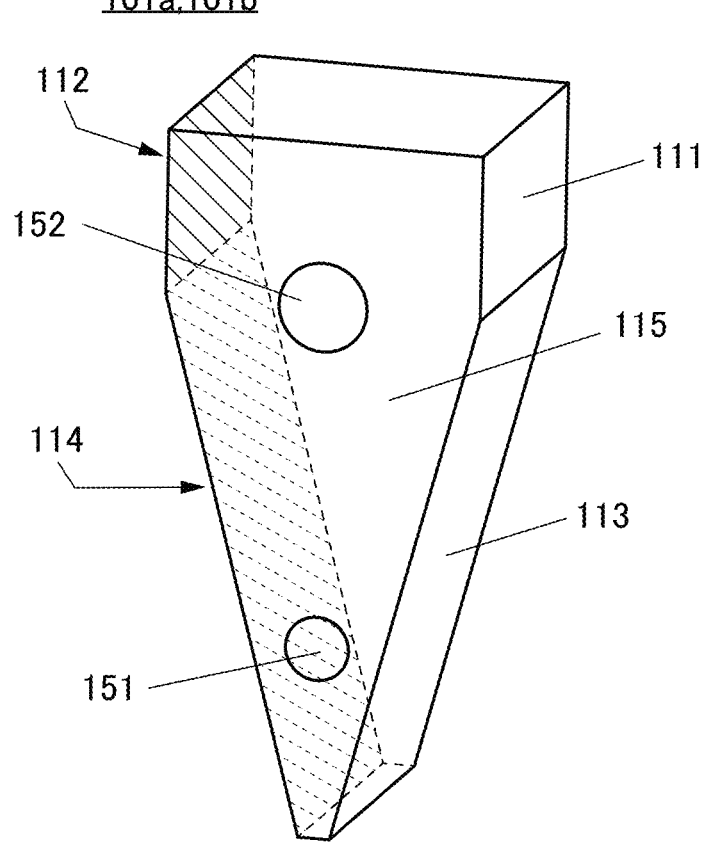
FIG. 2A is a diagram illustrating a base component.

FIG. 2A is a perspective view illustrating the shapes of the base components 101$a$ and 101$b$. The base components 101$a$ and 101$b$ can have the same shape and each include surfaces 111, 112, 113, 114, and 115. The surface 111 and the surface 112 can have the same shape. The surface 113 and the surface 114 can have the same shape.

The surface 111 and the surface 112 are positioned to be parallel to and face each other. The surface 113 is positioned adjacent to the surface 111. The surface 114 is positioned adjacent to the surface 112. The surface 113 is inclined at an angle greater than 180° and less than or equal to 270° for the surface 111. The surface 114 is inclined at an angle greater than 180° and less than or equal to 270° for the surface 112. The surface 113 is inclined at an angle greater than 180° and less than 360° for the surface 114. The surface 115 is positioned adjacent to each of the surface 111 to the surface 114.

A relative angle generated between the base component 101$a$ and the base component 101$b$ by a movement of the angle adjustment device 100 can be adjusted when the inclination angles of the surface 113 and the surface 114 are adjusted. Here, the relative angle refers to an angle generated between the base component 101$a$ and the base component 101$b$ when the positions of the base component 101$a$ and the base component 101$b$ are changed depending on a mechanism included in the angle adjustment device.

The surface 115 includes regions 151 and 152. Each of the regions 151 and 152 may be provided with an opening portion. Note that in this embodiment, the regions 151 and 152 of the base component 101$a$ are referred to as regions 151a and 152a. The regions 151 and 152 of the base component 101b are referred to as regions 151b and 152b.

It is preferable that the base components 101a and 101b and the columnar components 103a, 103b, 104a, and 104b not be deformed at the time of a movement and be formed using a hard material such as a metal, a resin, ceramics, or a complex including one or more of them.

Figure 2B:
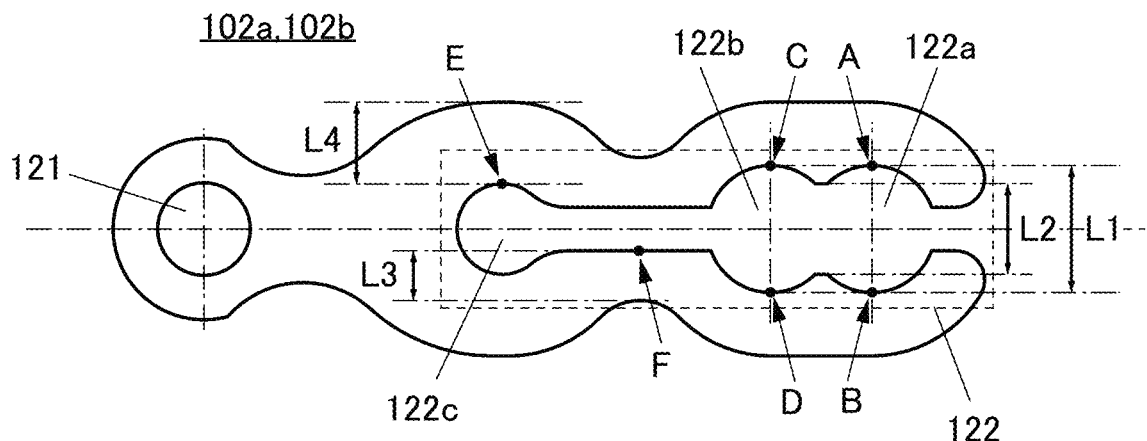
FIG. 2B is a diagram illustrating a joining component.

FIG. 2B is a top view for explaining the shapes of the joining components 102a and 102b. The joining components 102a and 102b can have the same shape and each include an opening portion 121 and a notch portion 122.

In the top view, the center of the opening portion 121 can be provided on a straight line that is parallel to the longitudinal direction of the notch portion 122 and passes through the center of the notch portion 122. The shapes of the joining components 102a and 102b can each be line-symmetric with the straight line as the axis. The columnar component 103a or the columnar component 103b can be inserted into the opening portion 121.

The notch portion 122 includes regions 122a, 122b, and 122c. The columnar component 104a or the columnar component 104b can be inserted into the region 122a or the region 122b. The region 122a and the region 122b are connected, and each of their top surface shapes includes two arcs.

As illustrated in FIG. 2B, one of the arcs of the region 122a has a point A and the other of the arcs has a point B; one of the arcs of the region 122b has a point C and the other of the arcs has a point D; the point A and the point B face each other; and the point C and the point D face each other. At this time, a distance L1 between the point A and the point B and between the point C and the point D is preferably substantially equal to or smaller than the diameter of a cross section of the columnar component 104a or 104b perpendicular to the major axis. A region where the region 122a and the region 122b are connected is provided with a region in which the width of the notch portion 122 in the minor axis direction is L2 that is smaller than L1.

The columnar component 104a or the columnar component 104b can be sandwiched between the two arcs; therefore, the position of the columnar component 104a or the columnar component 104b inserted into the notch portion 122 can be fixed easily.

The region 122c is provided between the opening portion 121 and the region 122b. The region 122b and the region 122c are connected, and the top surface shape of the region 122c has an arc.

The joining components 102a and 102b are preferably formed using a material that is a hard material such as a metal, a resin, or a complex thereof and has elasticity. Here, the shortest distance between a point E included in the arc of the region 122c and a periphery of the joining component 102a (or 102b) excluding the notch portion 122 is referred to as L4. At this time, when L4 is set to an appropriate value, part of the joining component 102a (or 102b) can be elastically deformed with the vicinity of the region 122c as a pivot, so that the lengths of L1 and L2 can be changed.

Figure 3A:
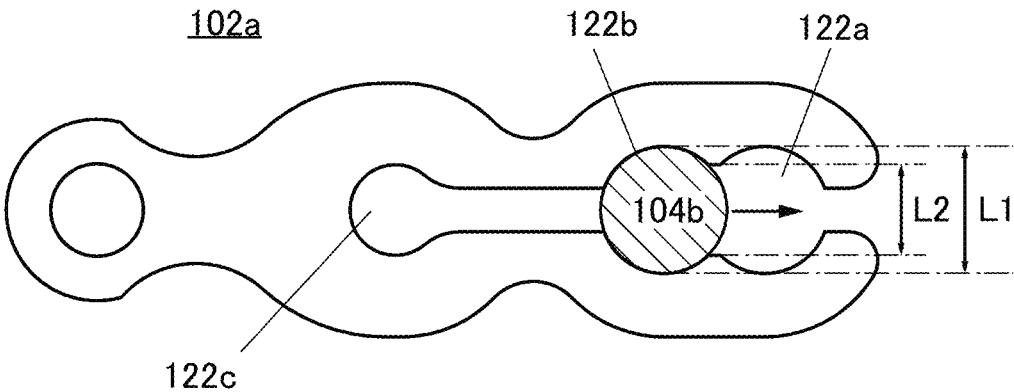
FIG. 3A to FIG. 3C are diagrams illustrating the joining component.
Figure 3B:
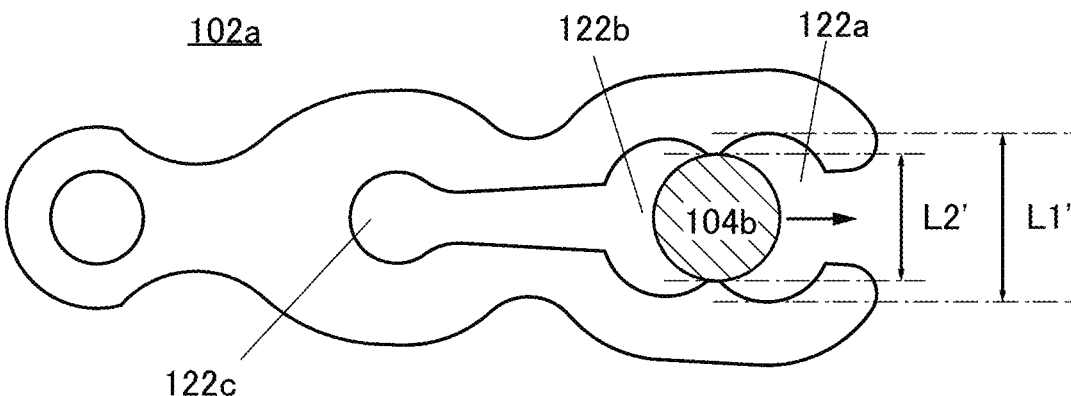

For example, the initial state is assumed to be a state where the columnar component 104b is inserted into the region 122b in the joining component 102a as illustrated in FIG. 3A. Next, as illustrated in FIG. 3B, when a force of transfer in the direction of the region 122a acts on the columnar component 104b, the joining component 102a is elastically deformed with the vicinity of the region 122c as a pivot, so that L1 is temporarily changed to L1'(L1<L1'). In addition, L2 is changed to L2'(L2<L2').

Figure 3C:
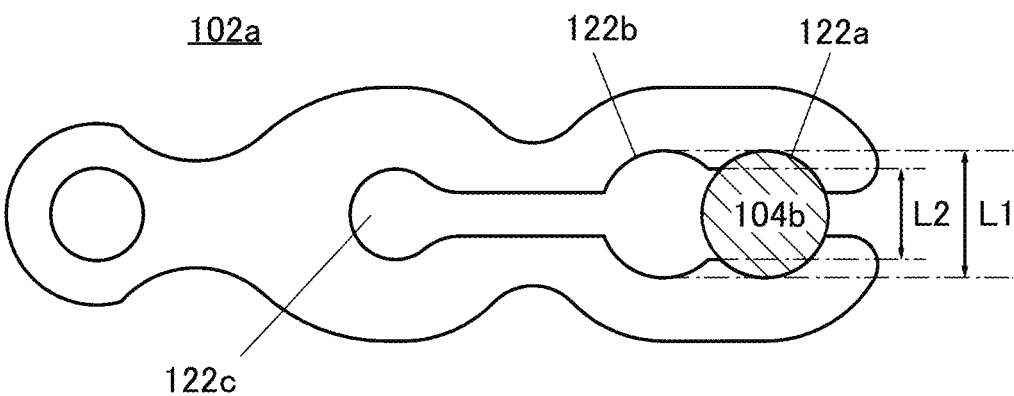

Then, as illustrated in FIG. 3C, with an additional force of transfer in the same direction acting on the columnar component 104b, elastic deformation of the joining component returns to the normal when the columnar component 104b enters the region 122a. Consequently, the columnar component 104b is inserted into the region 122a. Note that when a force of transfer in the opposite direction acts on the columnar component 104b, the columnar component 104b can return from the state illustrated in FIG. 3C to the state illustrated in FIG. 3A. The regions 122a and 122b can also be referred to as stable positions of the columnar component 104b in the notch portion 122. Note that although the two stable positions, the region 122c and the region 122b, are provided in the illustrated notch portion 122 in the example in this embodiment, the number of stable regions may be three or more.

The degree of the elastic deformation can be adjusted by the length of L4 illustrated in FIG. 2B. As the length of L4 becomes longer, elastic deformation is less likely to occur; as the length of L4 becomes shorter, elastic deformation is more likely to occur. Therefore, the length of L4 is adjusted depending on the usage.

Note that it is also possible to adjust the degree of the elastic deformation by adjusting the length of L3 that is the shortest distance between a point F included in a region between the region 122c and the region 122b and the periphery of the joining component 102a (or 102b) excluding the notch portion 122. The degree of the elastic deformation may be adjusted by change in the thickness (the length in a depth direction of FIG. 2B) of the joining component 102a (or 102b).

Figure 4:
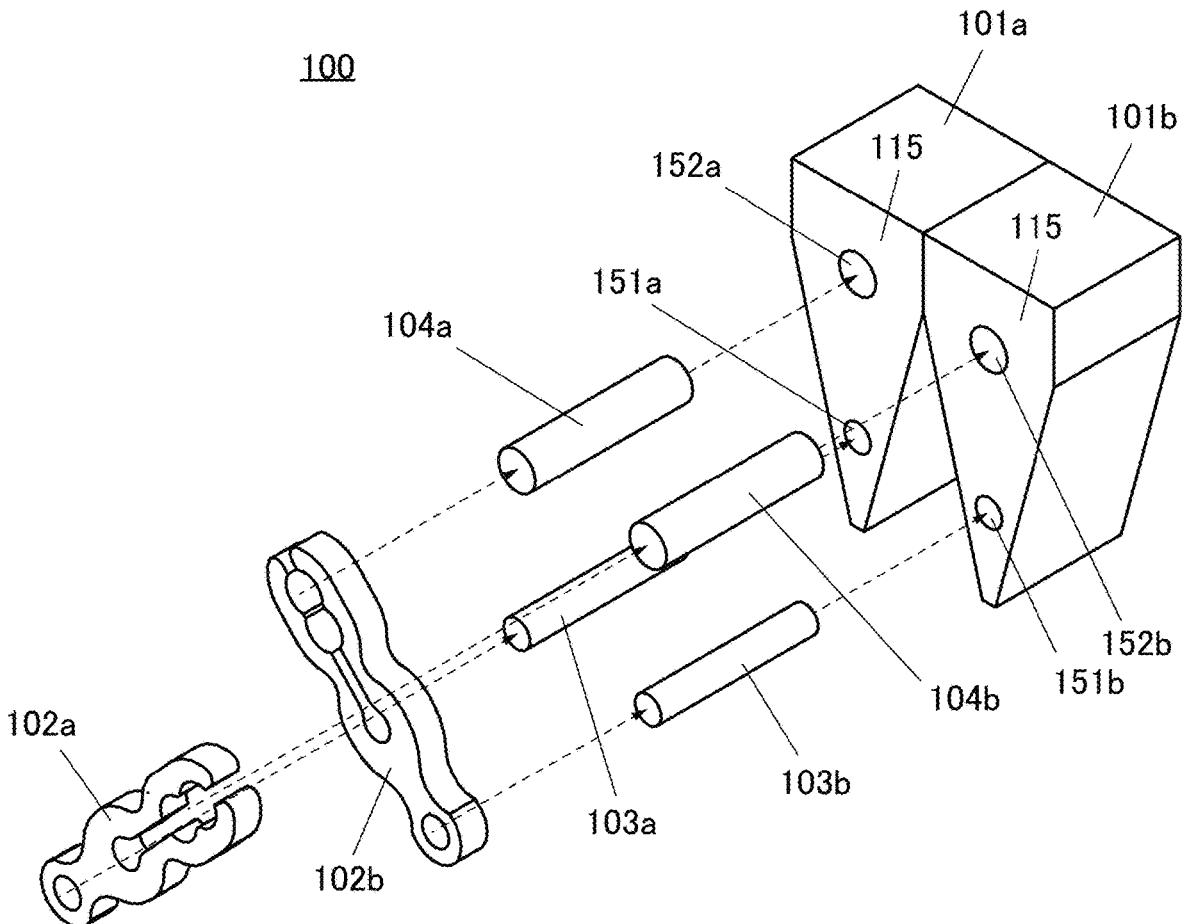
FIG. 4 is a diagram illustrating an angle adjustment device.

FIG. 4 is an exploded view of the angle adjustment device 100. In a form of the angle adjustment device 100, the surface 111 of the base component 101a and the surface 112 of the base component 101b are positioned to be in contact with each other.

One end portion of the columnar component 103a in a longitudinal direction is joined to the region 151a. One end portion of the columnar component 104a in a longitudinal direction is joined to the region 152a. One end portion of the columnar component 103b in a longitudinal direction is joined to the region 151b. One end portion of the columnar component 104b in a longitudinal direction is joined to the region 152b.

At this time, the major axes of the columnar components 103a, 103b, 104a and 104b are parallel to one another and perpendicular to the surfaces 115 of the base components 101a and 101b. The columnar components 103a and 103b and the columnar components 104a and 104b may be fixed to the base component 101a and the base component 101b. Alternatively, the columnar components 103a and 103b and the columnar components 104a and 104b may each be in a state of being capable of rotating with the center line as an axis. Alternatively, the columnar components 103a and 104a and the base component 101a may be one structure. The columnar components 103b and 104b and the base component 101b may be one structure.

In the above state, the columnar component 103b is inserted into the opening portion 121 of the joining component 102b, and the columnar component 104a is inserted into the region 122a in the notch portion 122 of the joining component 102b. The columnar component 103a is inserted into the opening portion 121 of the joining component 102a, and the columnar component 104b is inserted into the region 122a in the notch portion 122 of the joining component 102a. With the structure, the form illustrated in FIG. 1 is obtained.

At this time, the joining component 102*b* is in a state of being capable of rotating with the center line of the columnar component 103*b* as an axis. The joining component 102*a* is in a state of being capable of rotating with the center line of the columnar component 103*a* as an axis.

Figure 5A:
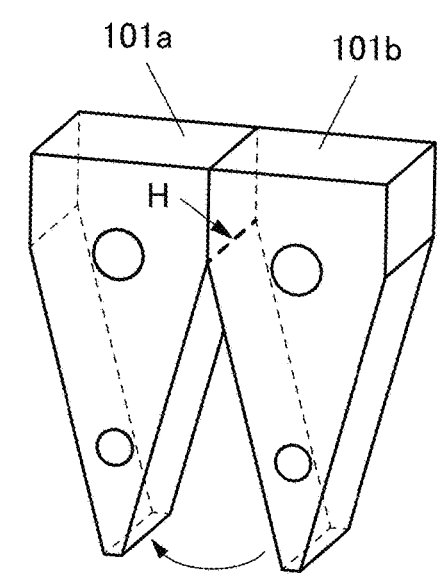
FIG. 5A to FIG. 5D are diagrams illustrating an angle adjustment device.
Figure 5B:
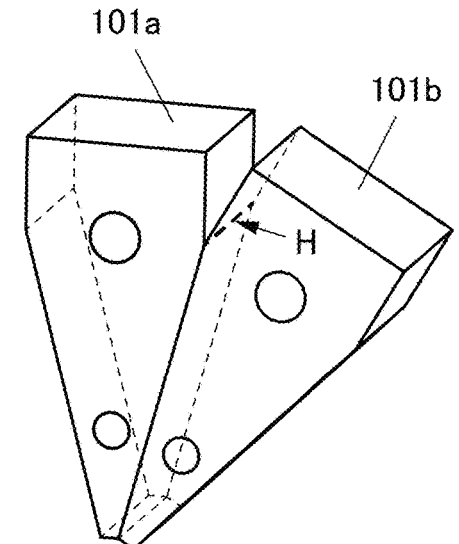

Here, as illustrated in FIG. 5A, the following case is considered: a rotation movement is made in the base components 101*a* and 101*b* using a side H, which is a side between the surface 111 and the surface 113 of the base component 101*a*, as a center axis, so that the state where the surface 111 of the base component 101*a* is in contact with the surface 112 of the base component 101*b* (FIG. 5A) is changed to the state where the surface 113 of the base component 101*a* is in contact with the surface 114 of the base component 101*b* (FIG. 5B). Note that the side H can also be referred to as a side between the surface 112 and the surface 114 of the base component 101*b*.

Figure 5C:
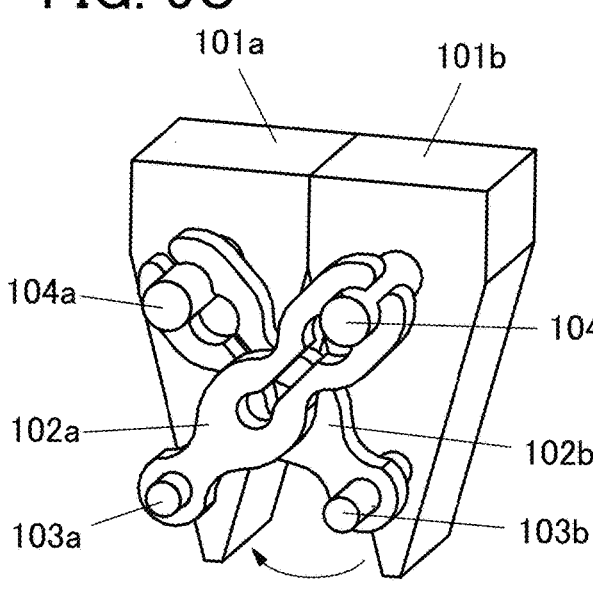
Figure 5D:
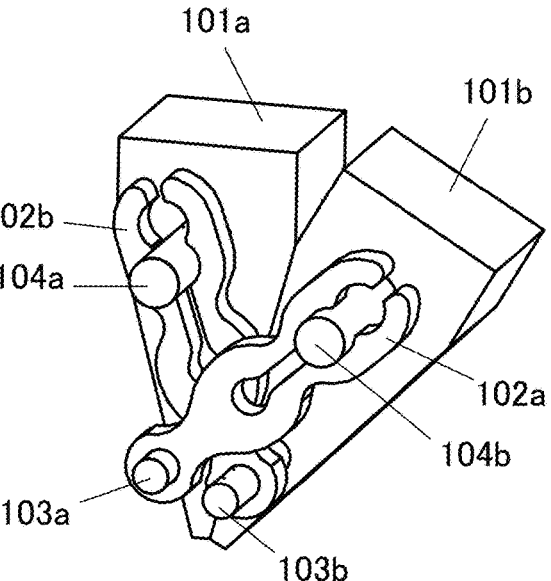

When the same movement as in the above is made in the structure of one embodiment of the present invention illustrated in FIG. 1, the joining component 102*b* moves so as to rotate with the center line of the columnar component 103*b* as an axis, and the position of the columnar component 104*a* inserted into the notch portion 122 is changed from the region 122*a* to the region 122*b*, as illustrated in FIG. 5C and FIG. 5D. Furthermore, the joining component 102*a* moves so as to rotate with the center line of the columnar component 103*a* as an axis, and the position of the columnar component 104*b* inserted into the notch portion 122 is changed from the region 122*a* to the region 122*b*.

To change the state of FIG. 5C to the state of FIG. 5D or change in the reverse manner, it is necessary to apply a force that causes elastic deformation of the joining components 102*a* and 102*b*. Therefore, the state of FIG. 5C or the state of FIG. 5D can be kept as long as the force is not applied. The change from the state of FIG. 5C to the state of FIG. 5D or the change in the reverse manner can be regarded as a change in the relative angle between the base component 101*a* and the base component 101*b*. Therefore, one embodiment of the present invention can be used as the angle adjustment device.

Figures 6A, 6B:
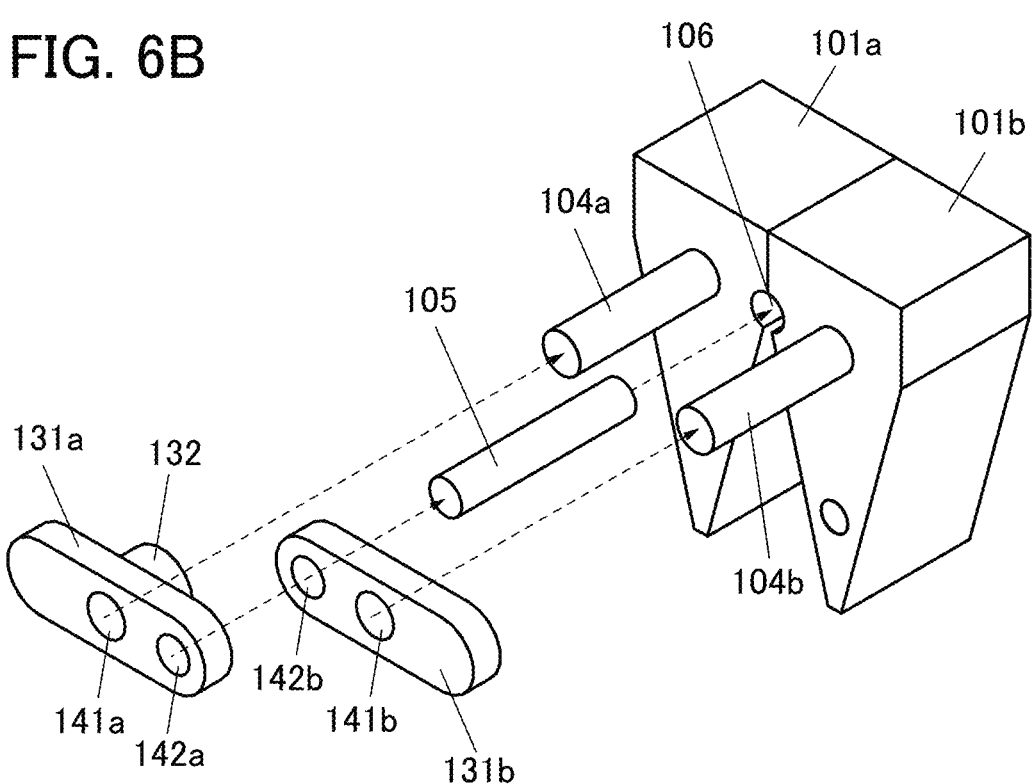
FIG. 6A and FIG. 6B are diagrams illustrating an angle adjustment device.

Furthermore, as illustrated in FIG. 6A and FIG. 6B, joining components 131*a* and 131*b* may be added to the angle adjustment device of one embodiment of the present invention and a physical rotation axis (a columnar component 105) may be provided in the position of the side H.

FIG. 6A illustrates the state where the base components 101*a* and 101*b* and the joining components 131*a* and 131*b* are assembled. FIG. 6B is an exploded view thereof. The joining components 131*a* and 131*b* and the columnar component 105 are provided, whereby the movement of the angle adjustment device 100 can be made more smoothly and the mechanical strength can be further enhanced.

A notch 106 into which the columnar component 105 can be inserted is provided in a region corresponding to the position of the side H illustrated in FIG. 5A and the vicinity thereof in the base components 101*a* and 101*b*. Note that the notch 106 is divided into a notch region provided in the base component 101*a* and a notch region provided in the base component 101*b*. A cylindrical-shaped component can be used as the columnar component 105, and at least one end portion is inserted into the notch 106. The center axis of the columnar component 105 preferably overlaps with the side H illustrated in FIG. 5A.

The joining component 131*a* includes opening portions 141*a* and 142*a*, and the columnar component 104*a* is inserted into the opening portion 141*a*. The joining component 131*b* includes opening portions 141*b* and 142*b*, and the columnar component 104*b* is inserted into the opening portion 141*b*. Part of the joining component 131*a* and part of the joining component 131*b* are positioned to overlap with each other, and the columnar component 105 is inserted into the opening portion 142*a* and the opening portion 142*b*.

Note that in FIG. 6A and FIG. 6B, the joining component 131*b* and the joining component 131*a* are positioned in the inner side and the outer side, respectively, from the base components 101*a* and 101*b* side, and therefore, the joining component 131*a* is provided with a spacer 132 for stabilizing the position. The thickness of the spacer 132 is preferably equal to or larger than the thickness of the joining component 131*b*. Note that in the case where the joining component 131*b* and the joining component 131*a* are positioned in the outer side and the inner side, respectively, from the base components 101*a* and 101*b* side, the joining component 131*b* is provided with the spacer 132.

Here, the joining component 131*a* is preferably fixed to the base component 101*a*. Alternatively, the joining component 131*a* can be fixed to the columnar component 104*a* fixed to the base component 101*a*. The joining component 131*b* is preferably fixed to the base component 101*b*. Alternatively, the joining component 131*b* can be fixed to the columnar component 104*b* fixed to the base component 101*b*. Alternatively, the base component 101*a*, the columnar component 104*a*, and the joining component 131*a* may be one structure. Alternatively, the base component 101*b*, the columnar component 104*b*, and the joining component 131*b* may be one structure.

The columnar component 105 is preferably fixed to either the joining component 131*a* or the joining component 131*b*. Alternatively, the columnar component 105 may be fixed to either the notch region provided in the base component 101*a* or the notch region provided in the base component 101*b*, which form the notch 106. Such a structure allows a rotation movement of the base components 101*a* and 101*b* with the columnar component 105 as an axis as illustrated in FIG. 7A and FIG. 7B.

Note that in the state of FIG. 7A, the columnar component 105 is the rotation axis and the surface 111 of the base component 101*a* and the surface 112 of the base component 101*b* are in contact with each other, and therefore, a rotation movement in a reverse direction can be inhibited.

FIG. 7C and FIG. 7D illustrate the structure where the columnar components 103*a* and 103*b* and the joining components 102*a* and 102*b* are added to the structure illustrated in FIG. 6A and FIG. 6B and a change in shape due to a movement of the structure. This structure can increase the reliability in movement and the strength of the angle adjustment device 100.

Figure 8A:
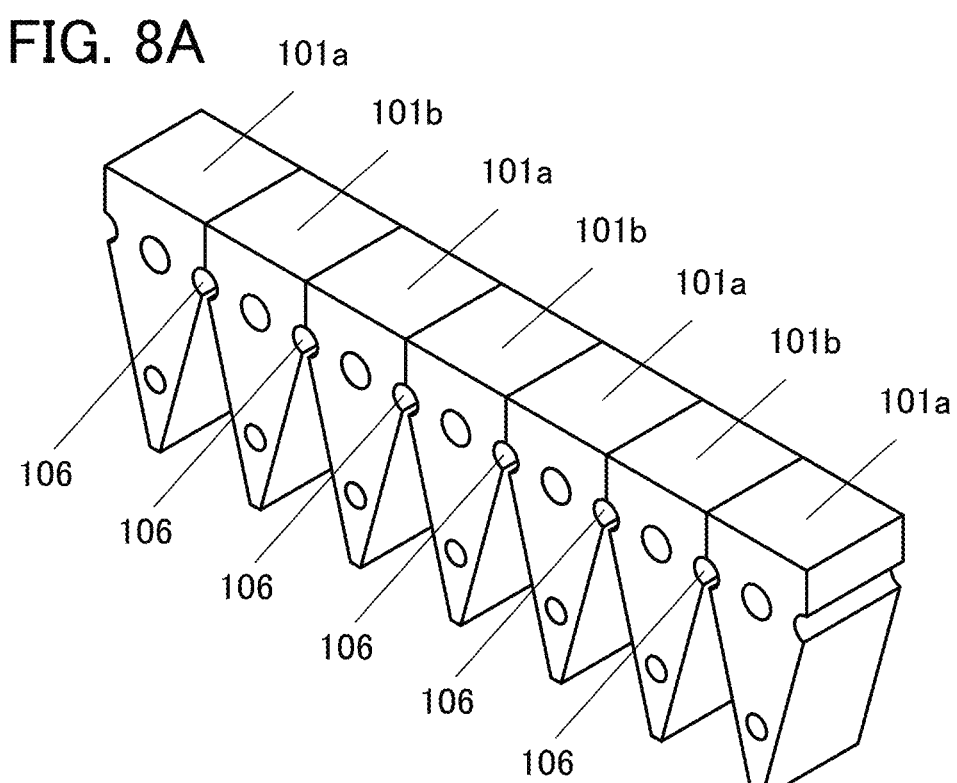
FIG. 8A and FIG. 8B are diagrams illustrating an angle adjustment device.
Figure 8B:
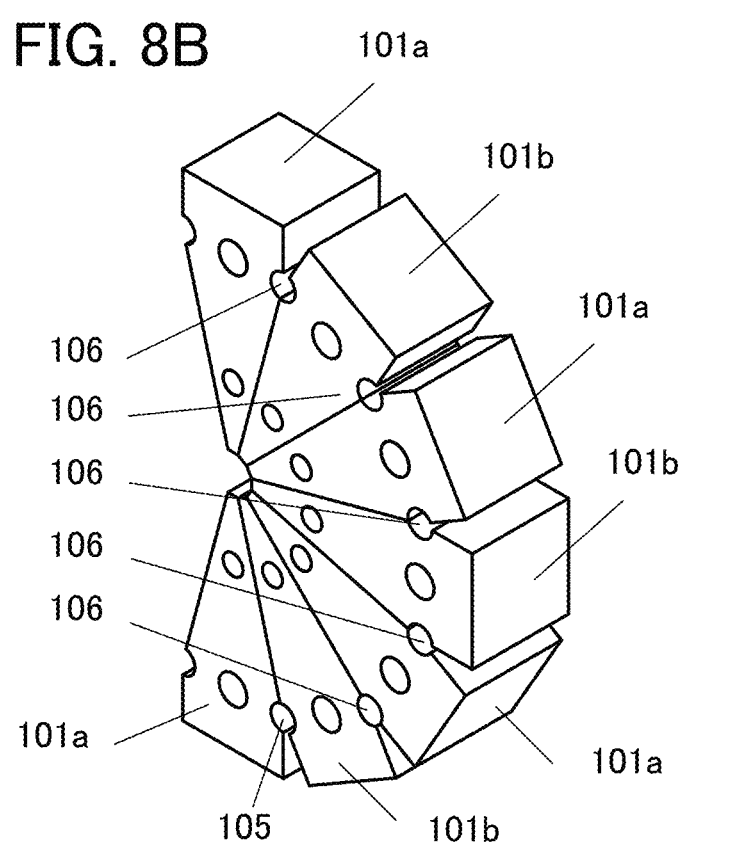

A minimum structure where the base component 101*a* and the base component 101*b* are one pair has been described above; however, the total number of base components 101*a* and 101*b* may be three or more. FIG. 8A and FIG. 8B illustrate a structure where the total number of base components 101*a* and 101*b* is seven, as an example. FIG. 8A and FIG. 8B illustrate only the base components 101*a* and the base components 101*b*.

Note that in this embodiment, the expression "folding" is used for a movement for changing the state of FIG. 8A to the state of FIG. 8B. In addition, the expression "opening" is used for a movement for changing the state of FIG. 8B to the state of FIG. 8A.

It is possible to change the relative angle between the base component 101*a* and the base component 101*b* that is generated due to folding by adjusting inclination angles of the surfaces 113 and the surfaces 114 in the base component 101*a* and the base component 101*b*. The angle becomes smaller as the inclination of the surface 113 for the surface 114 is reduced and becomes larger as the inclination of the surface 113 for the surface 114 is increased. Furthermore, it is possible to adjust the maximum value of an angle at which the angle adjustment device is foldable as a whole by adjusting the number of base components 101*a* and 101*b*.

In the structure of FIG. 8A and FIG. 8B, the base components 101*a* and the base components 101*b* are alternately arranged. Thus, the notch 106 is provided between adjacent two of all the base components 101*a* and 101*b*.

Figures 9A, 9B, 9C:
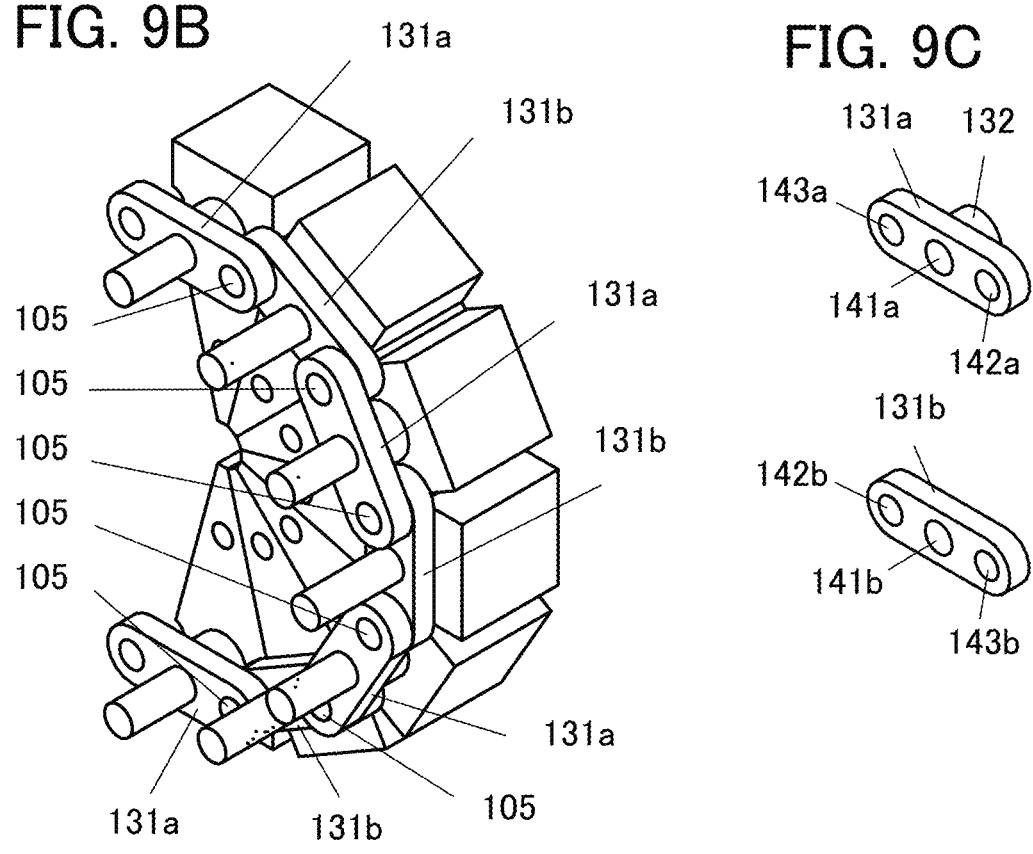
FIG. 9A to FIG. 9C are diagrams illustrating an angle adjustment device.

FIG. 9A and FIG. 9B are diagrams each illustrating a state where the joining components 131*a* and 131*b* are combined with the structure of FIG. 8A and FIG. 8B. FIG. 9A illustrates an opened state and FIG. 9B illustrates a folded state.

Here, a structure different from that illustrated in FIG. 6B is employed for the joining components 131*a* and 131*b*. As illustrated in FIG. 9C, an opening portion 143*a* is provided in the joining component 131*a* so as to be symmetrical with the opening portion 142*a* with the opening portion 141*a* as the center. In addition, an opening portion 143*b* is provided in the joining component 131*b* so as to be symmetrical with the opening portion 142*b* with the opening portion 141*b* as the center.

As illustrated in FIG. 9A and FIG. 9B, the base component 101*a* is provided with the joining component 131*a* and the base component 101*b* is provided with the joining component 131*b*. The opening portion 142*a* and the opening portion 142*b* overlap with each other and the columnar component 105 is inserted into them. The opening portion 143*a* and the opening portion 143*b* overlap with each other and the columnar component 105 is inserted into them.

Figures 10A, 10B:
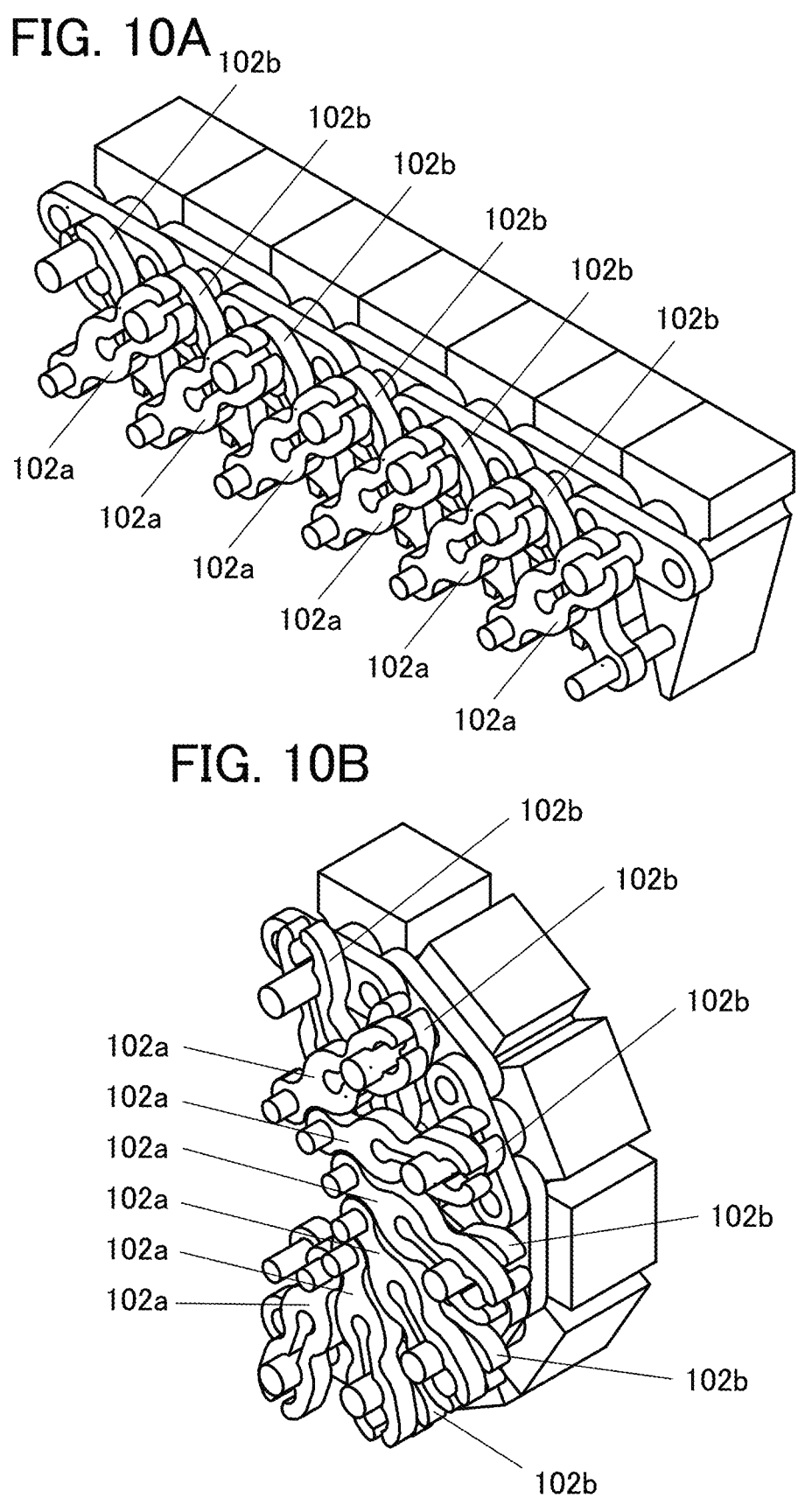

FIG. 10A and FIG. 10B are diagrams each illustrating a state where the structure of FIG. 9A and FIG. 9B is combined with the joining components 102*a* and 102*b*. FIG. 10A illustrates an opened state and FIG. 10B illustrates a folded state.

In the structure of FIG. 10A and FIG. 10B, the base components 101*a* and the base components 101*b* are alternately arranged. Thus, adjacent two of all the base components 101*a* and 101*b* are provided with the joining component 102*a* and the joining component 102*b*.

This structure allows a plurality of folded forms and makes it possible to keep the forms. Therefore, the structure can be effectively used as a hinge of a support that will be described next.

<Support>

Figures 11A, 11B, 11C:
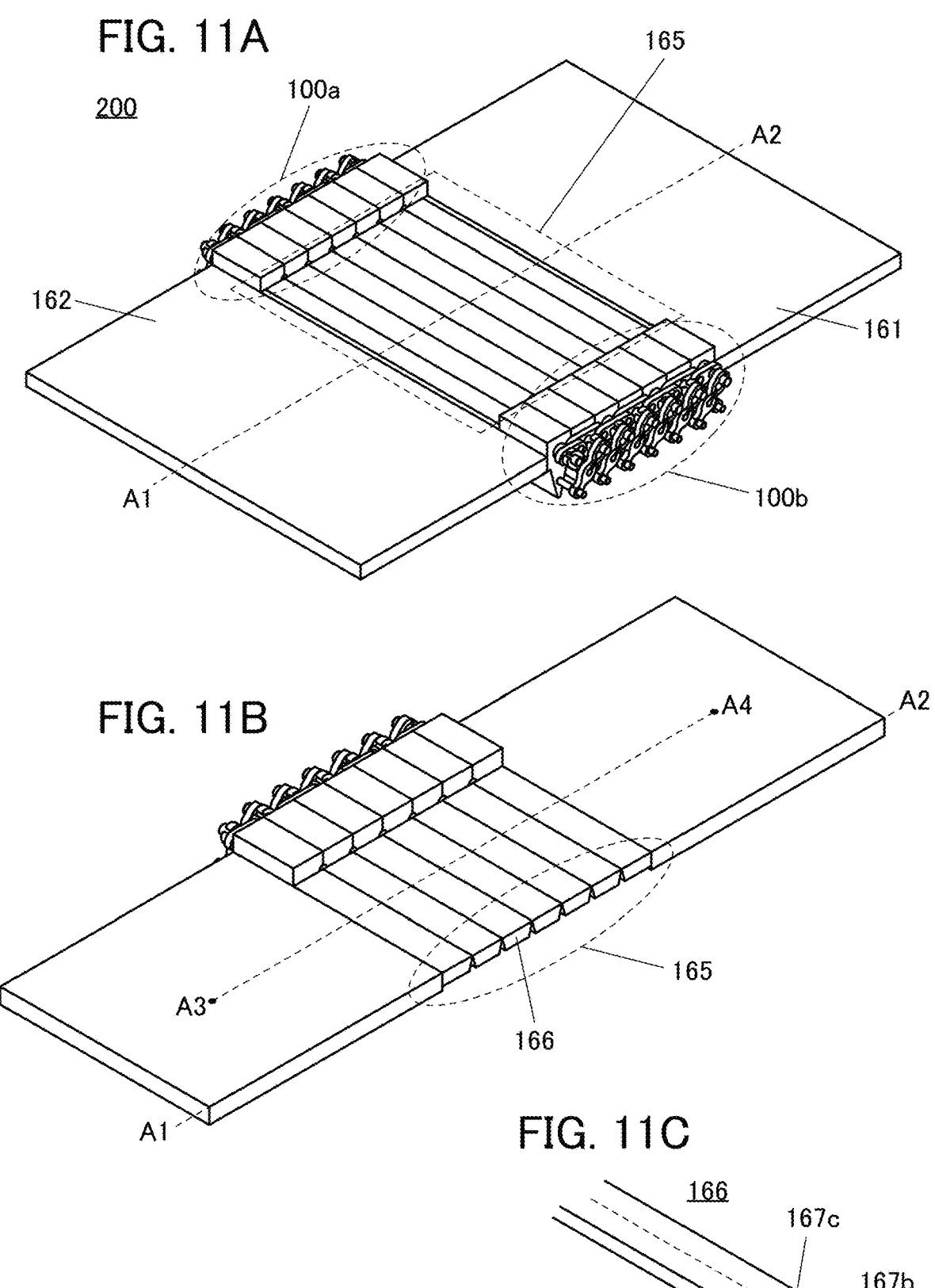
FIG. 11A to FIG. 11C are diagrams illustrating a support.

FIG. 11A is a perspective view illustrating a support 200 provided with the angle adjustment device 100 of one embodiment of the present invention. The support 200 includes two angle adjustment devices 100 (angle adjustment devices 100*a* and 100*b*), flat-plate portions 161 and 162, and a bend portion 165. FIG. 11A corresponds to a state where the support 200 is opened.

The bend portion 165 includes a plurality of columnar bodies 166, and one end portion of each of the columnar bodies 166 in a longitudinal direction is joined to the base component 101*a* or the base component 101*b* of the angle adjustment device 100*a*. The other end portion of each of the columnar bodies 166 in the longitudinal direction is joined to the base component 101*a* or the base component 101*b* of the angle adjustment device 100*b*. Such a combination of the bend portion 165 and the angle adjustment devices 100 can be referred to as a hinge. The flat-plate portion 161 is joined to one end portion of the hinge, and the flat-plate portion 162 is joined to the other end portion of the hinge.

FIG. 11B is a perspective view illustrating a cross section in a position along line A1-A2 in FIG. 11A. The columnar body 166 has a trapezoid-shaped or substantially-trapezoid-shaped cross section perpendicular to the major axis, and as illustrated in FIG. 11C, the columnar body 166 includes a side surface 167*a* (surface including one leg of the trapezoid), a side surface 167*b* (surface including the other leg of the trapezoid), a side surface 167*c* (surface including a bottom base of the trapezoid), and a side surface 167*d* (surface including a top base of the trapezoid). The bend portion 165 includes the plurality of columnar bodies 166 with a structure in which the side surface 167*a* of one of adjacent two of the columnar bodies 166 is adjacent to the side surface 167*b* of the other of the two columnar bodies 166.

The columnar bodies 166 are joined so that the side surfaces 167*c* (surfaces including the bottom bases of the trapezoids) form a substantially continuous surface. Furthermore, the side surface 167*c* of the columnar body 166 in the one end portion of the hinge is joined so as to be continuous with a first surface of the flat-plate portion 161. The side surface 167*c* of the columnar body 166 in the other end portion of the hinge is joined so as to be continuous with a first surface of the flat-plate portion 162. Note that the shape of the side surface 167*d* (surface including the top base of the trapezoid) of each columnar body 166 is freely determined as long as it does not interfere with the other columnar bodies 166 or the flat-plate portions 161 and 162. Accordingly, the cross section of the columnar body 166 perpendicular to the major axis may be a triangle or a substantial triangle.

As described above, the flat-plate portion 161, the bend portion 165 (the bottom surfaces of the plurality of columnar bodies 166), and the flat-plate portion 162 are continuous planes, and the distance between a given point A3 on the flat-plate portion 162 and a given point A4 on the flat-plate portion 161 illustrated in FIG. 11B is constant regardless of the state of the bend portion 165. Therefore, in the case where a flexible component or the like is attached to the support, it is preferably attached to the planes. The support of one embodiment of the present invention enables the form to be kept even in the opened state as illustrated in FIG. 11A and FIG. 11B. It is further preferable that the planes be designed to be below a plane including the axes of the plurality of columnar components 105 and the plane including the axes of the plurality of columnar components 105 be closer to a neutral plane of the flexible component.

Figure 12A:
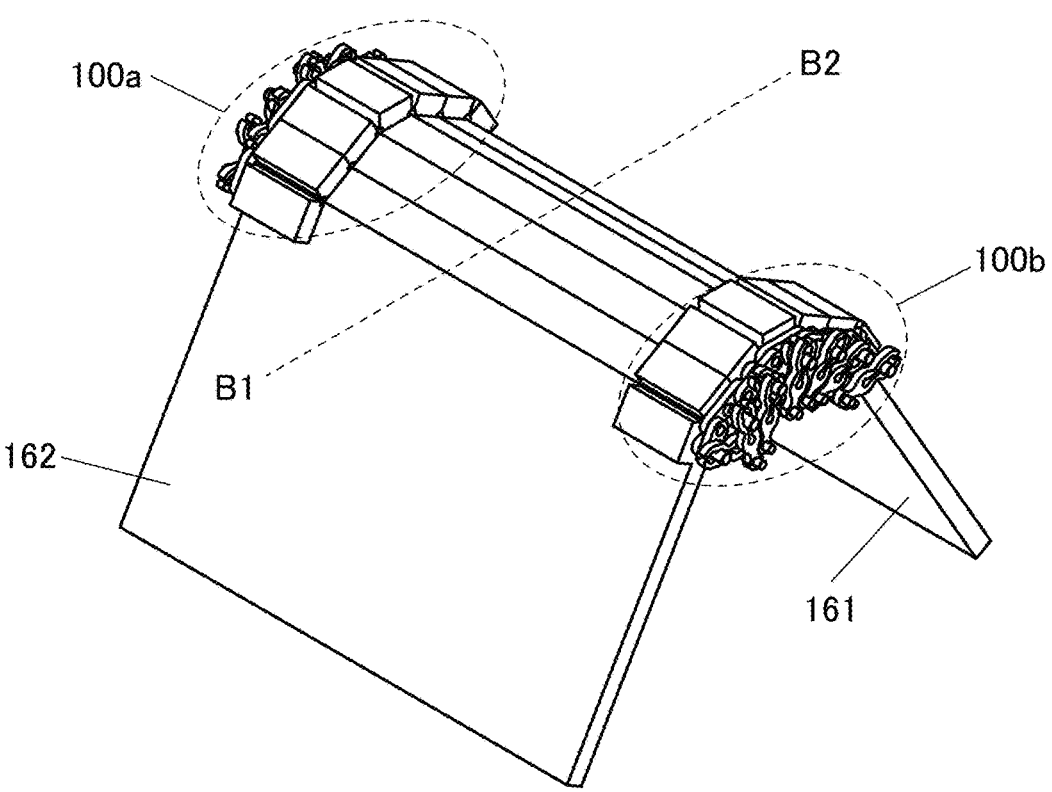
FIG. 12A and FIG. 12B are diagrams illustrating a support.
Figure 12B:
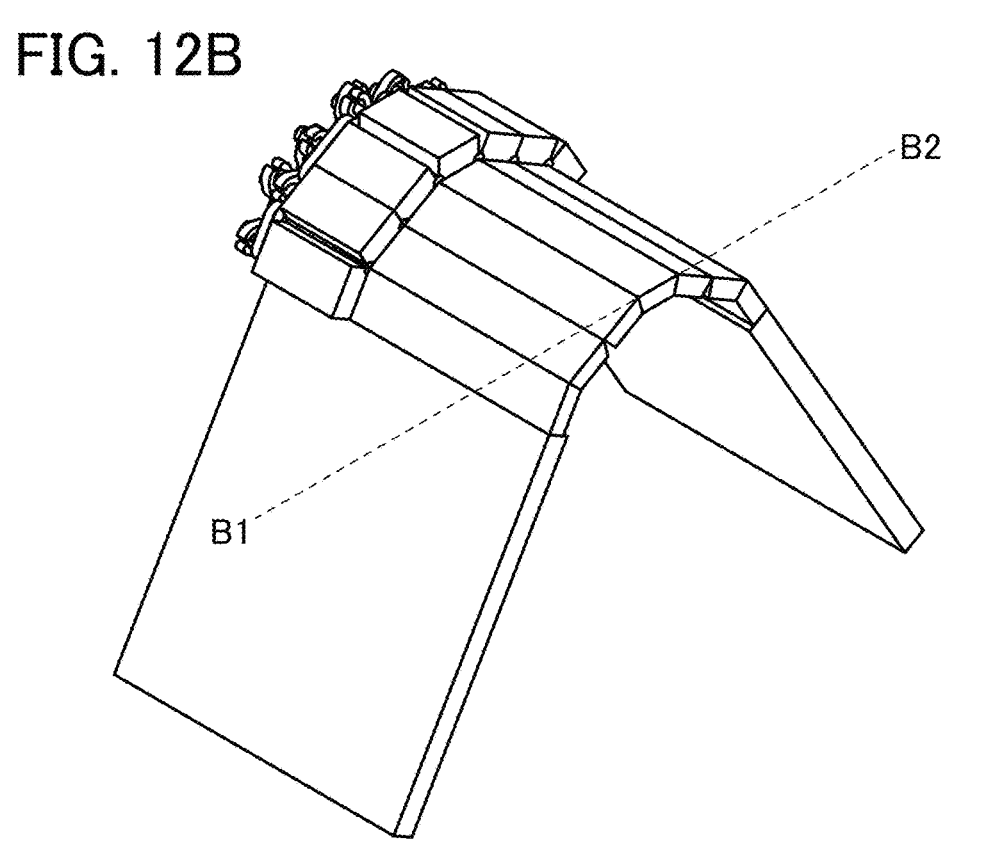

FIG. 12A is a diagram illustrating an example of a case where the support 200 is transformed from the opened state to the folded state or a transitional state (intermediate state) in the reverse manner. FIG. 12B is a perspective view illustrating a cross section in a position along line B1-B2 in FIG. 12A.

FIG. 12A and FIG. 12B illustrates a form in which a region where the side surface 167*a* of one of two adjacent columnar bodies 166 faces and is in contact with the side surface 167*b* of the other of the two adjacent columnar bodies 166 and a region where the side surface 167*a* of one of different adjacent two columnar bodies 166 is not in contact with the side surface 167*b* of the other of the different two adjacent columnar bodies 166 are mixed. The support of one embodiment of the present invention enables the form to be kept even in the transitional state illustrated in FIG. 12A and FIG. 12B.

Figure 13A:
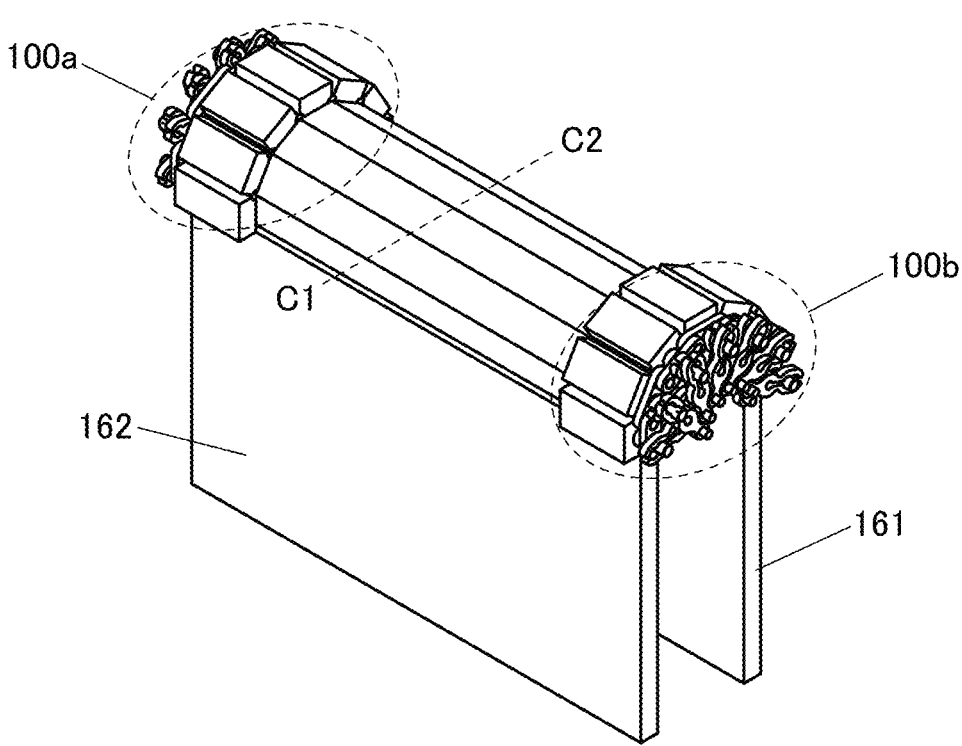
FIG. 13A and FIG. 13B are diagrams illustrating a support.
Figure 13B:
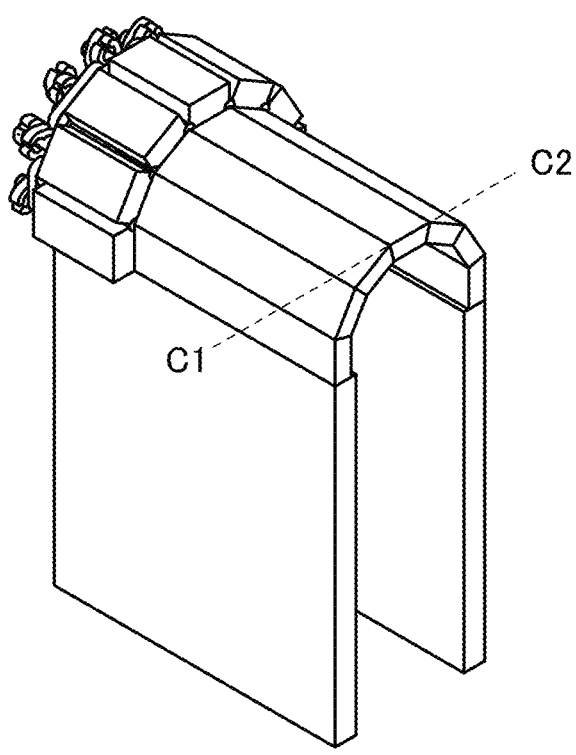

FIG. 13A is a diagram illustrating a state where the support 200 is folded. FIG. 13B is a perspective view illustrating a cross section in a position along line C1-C2 in FIG. 13A.

In the form illustrated in FIG. 13A and FIG. 13B, in adjacent two of all the columnar bodies 166, the side surface 167a of one of the two columnar bodies faces and is in contact with the side surface 167b of the other of the two columnar bodies. The support of one embodiment of the present invention enables the form to be kept even in the folded state illustrated in FIG. 13A and FIG. 13B <Display Device>

The support 200 can be used for supporting a flexible component. When a display panel is used as the flexible component, a flexible display device can be formed.

Figure 14A:
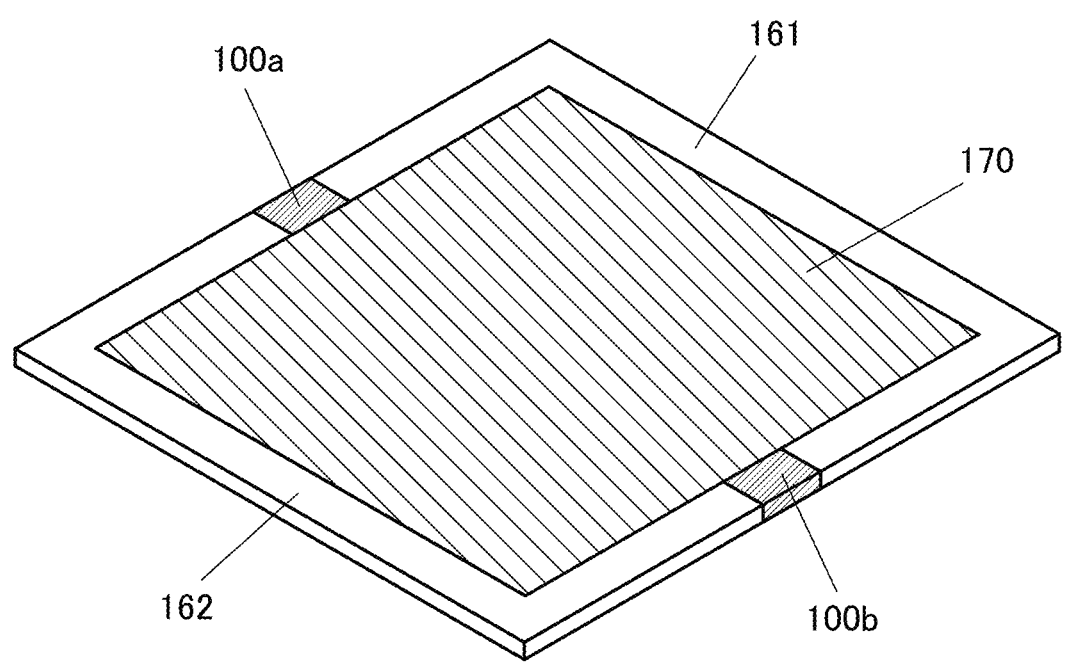
FIG. 14A and FIG. 14B are diagrams illustrating a display device.
Figure 14B:
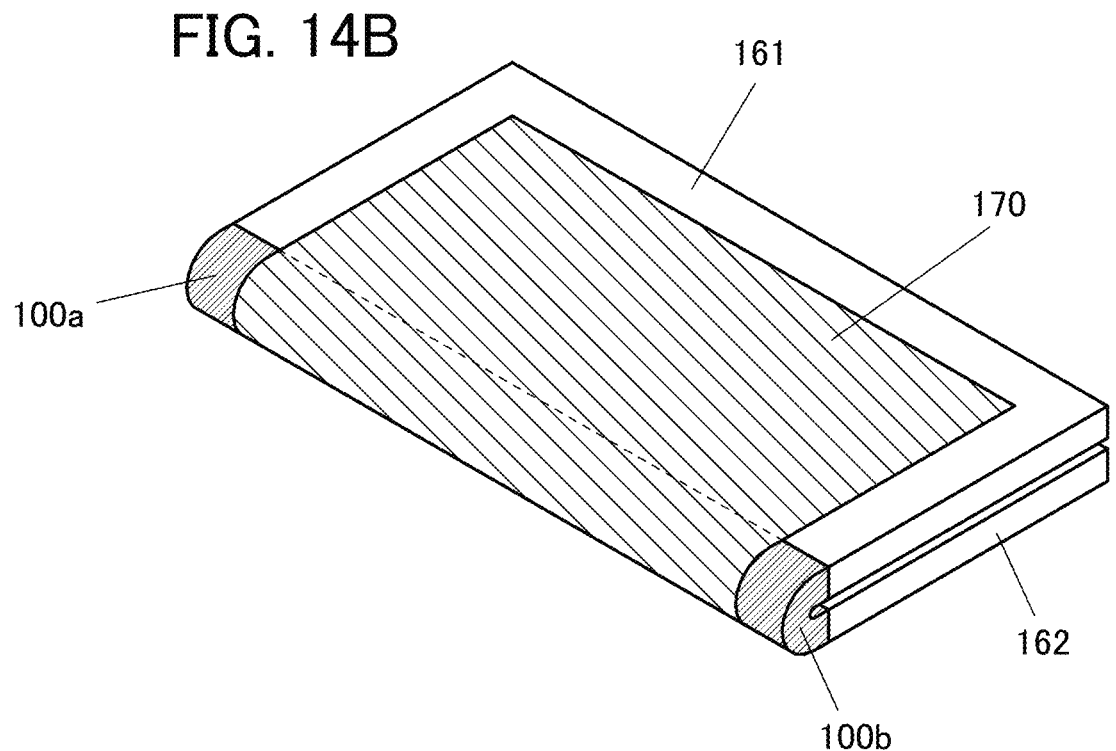

FIG. 14A and FIG. 14B are diagrams illustrating and example of a two-foldable display device. Note that the angle adjustment devices 100a and 100b included in the support 200 are simplified in the diagrams. FIG. 14A illustrates the display device in the opened state, and FIG. 14B illustrates the display device in the folded state.

A display panel 170 is flexible, and an EL display device provided over a thin-plate-shaped resin or glass can be used, for example.

The display panel 170 can be provided along a continuous plane portion included in the flat-plate portion 161, the bend portion 165 (the bottom surfaces of the plurality of columnar bodies 166), and the flat-plate portion 162 illustrated in FIG. 11A and the like. Thus, as illustrated in FIG. 14B, a display surface of the display panel forms a convex curved surface in the folded state.

Although the angle adjustment devices 100a and 100b, the flat-plate portion 161, the flat-plate portion 162, and the like are illustrated in FIG. 14A and FIG. 14B, they may be stored in a housing of the display device.

Figure 15A:
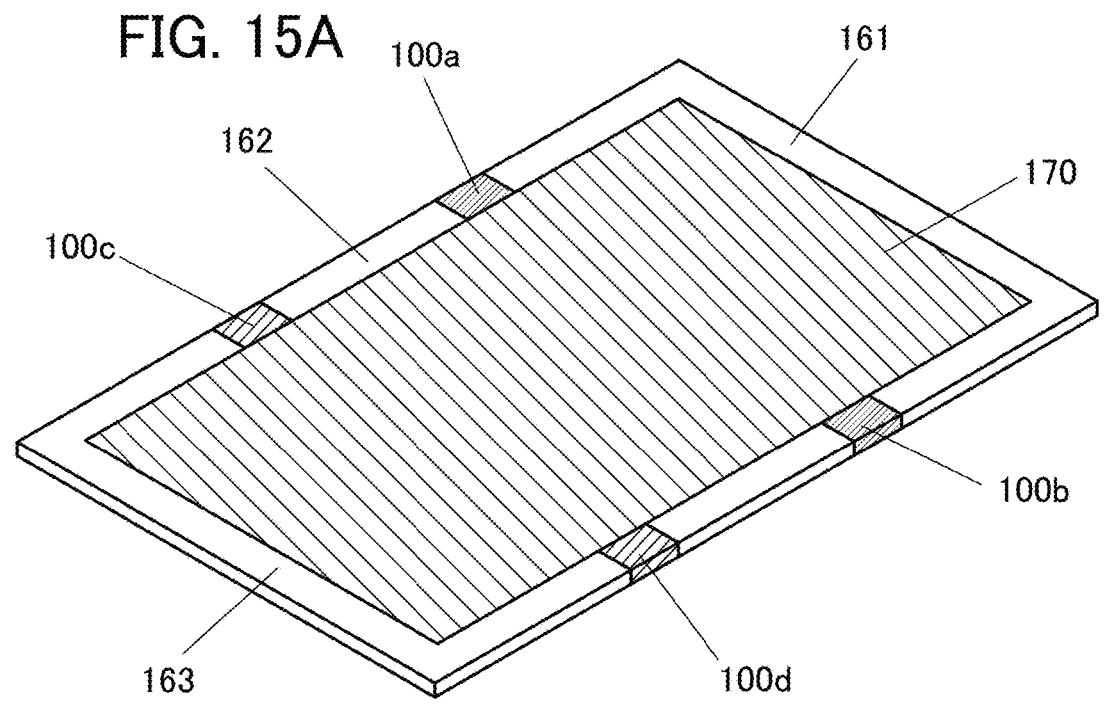
FIG. 15A and FIG. 15B are diagrams illustrating a display device.
Figure 15B:
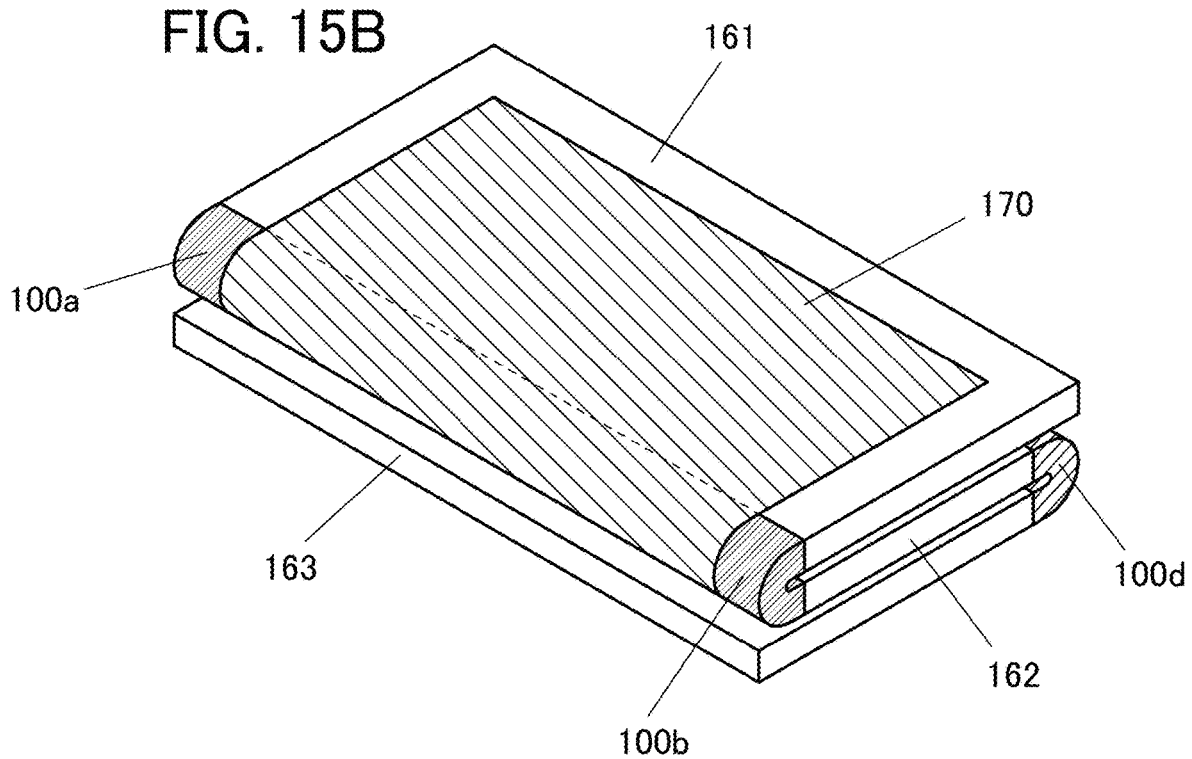

FIG. 15A and FIG. 15B are diagrams illustrating an example of a three-foldable display device. The angle adjustment devices 100a, 100b, 100c, and 100d included in the support 200 are simplified in the diagrams. FIG. 15A illustrates the display device in the opened state, and FIG. 15B illustrates the display device in the folded state.

The three-fold display device is different from the two-fold display device in that the angle adjustment devices 100c and 100d and a flat-plate portion 163 are provided in the support. The flat-plate portion 163 is joined to the flat-plate portion 162 with the angle adjustment devices 100c and 100d.

Although the angle adjustment devices 100a, 100b, 100c, and 100d, the flat-plate portion 161, the flat-plate portion 162, the flat-plate portion 163, and the like are illustrated in FIG. 15A and FIG. 15B, they may be stored in a housing of the display device.

Here, as illustrated in FIG. 15B, a concave curved surface is formed on the display surface of the display panel to extend to the flat-plate portion 162 and the flat-plate portion 163. Therefore, a structure different from those of the angle adjustment devices 100a and 100b is preferably used for the angle adjustment devices 100c and 100d.

Figure 16A:
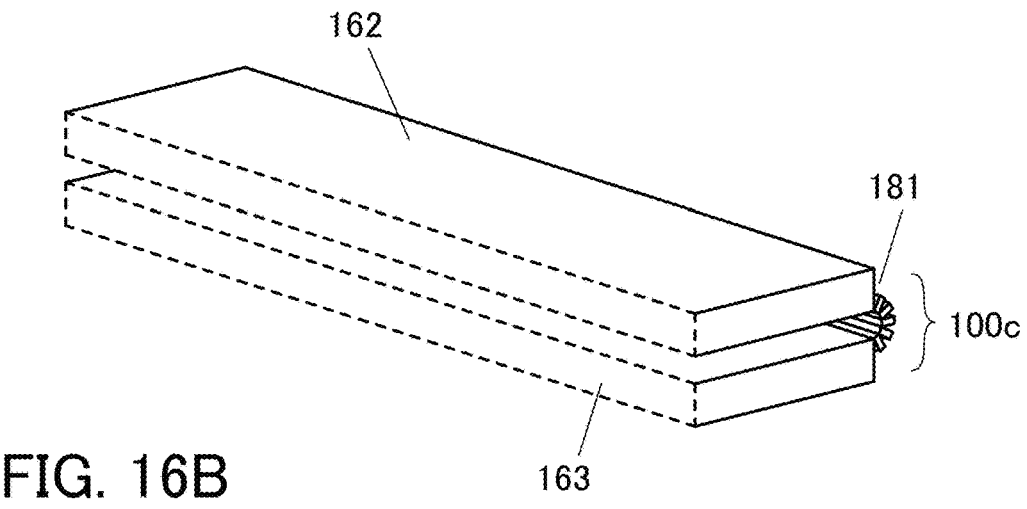
FIG. 16A to FIG. 16C are diagrams illustrating a support.
Figure 16B:
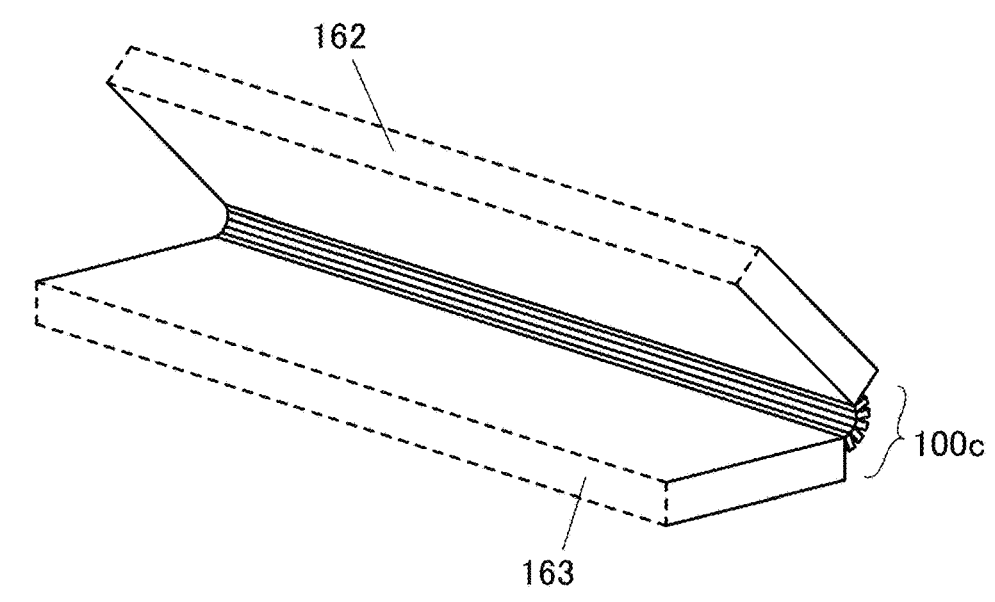
Figure 16C:
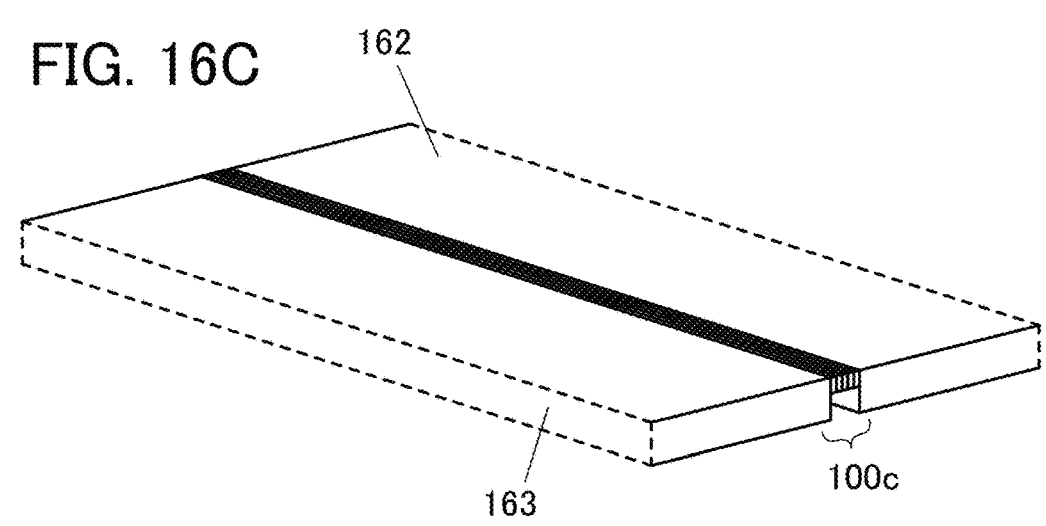

For example, a structure illustrated in FIG. 16A to FIG. 16C can be used for the angle adjustment devices 100c and 100d. Note that since the angle adjustment device 100c and the angle adjustment device 100d illustrated in FIG. 15A and FIG. 15B are continuous, only one of the angle adjustment devices illustrated in FIG. 16A to FIG. 16C is denoted by the reference numeral.

The angle adjustment device 100c includes a plurality of columnar bodies 181 each with a rectangular or substantially rectangular cross section perpendicular to the major axis. The columnar body 181 includes a first side surface (surface including one side of the substantial rectangle) and a second side surface (surface including a side facing the one side of the substantial rectangle). In the plurality of columnar bodies 181, the first side surface of one of two adjacent columnar bodies 181 is adjacent to the second side surface of the other of the two adjacent columnar bodies 181.

The columnar bodies 181 are joined so that third side surfaces (surfaces each including a side substantially perpendicular to the one side) form continuous surfaces. The third side surface of the columnar body 181 in one end portion of the angle adjustment device 100c is joined so as to be continuous with the first surface of the flat-plate portion 162. The third side surface of the columnar body 181 in the other end portion of the angle adjustment device 100c is joined so as to be continuous with the first surface of the flat-plate portion 163. Note that the shape of a fourth side surface (surface facing the third side surface) of each columnar body 181 is freely determined as long as it does not interfere with the other columnar bodies or the housing.

As illustrated in FIG. 16A, when adjacent two of the columnar bodies 181 are transformed in a direction in which the first side surface of one of the two adjacent columnar bodies 181 and the second side surface of the other of the two adjacent columnar bodies 181 are apart from each other, the display device can be in the folded state. At this time, the third side surfaces of the plurality of columnar bodies 181 extend with a certain angle, and therefore a region where the whole cross section has a substantially circular arc shape is formed. Accordingly, the flexible display panel can form a concave curved surface in a portion overlapping with the region.

When a transformation movement (opening movement) is made from the state in FIG. 16A, adjacent two of the columnar bodies 181 move so that the first side surface of one of the two columnar bodies 181 is closer to the second side surface of the other of the two columnar bodies 181, whereby a curvature radius of the substantial circular arc changes to be larger as illustrated in FIG. 16B. At this time, a curvature radius of a curved surface portion changes so as to be larger also in the display panel.

When a transformation movement is further made from the state in FIG. 16B, as illustrated in FIG. 16C, the first surface of the flat-plate portion 162, the third side surface of each of the columnar bodies 181, and the first surface of the flat-plate portion 163 are continuous with each other so as to be flat. At this time, the curved surface portion of the display panel also changes so as to be flat, and the entire display panel is set in an opened state so as to be flat. When a transformation movement is made in a reverse order of the above, the display panel can be folded.

Note that since the cross section of the columnar body 181 is a rectangle, when the display panel is opened so as to be flat, in adjacent two of the columnar bodies 181, the first side surface of one of the columnar bodies 181 is in contact with the second side surface of the other of the columnar bodies 181. Accordingly, the angle adjustment device 100c does not cause bending in the display panel in a reverse direction, and mechanism to inhibit reverse bending may be unnecessary. Note that a spacer for keeping a gap between housings during folding may be provided.

Figure 17A:
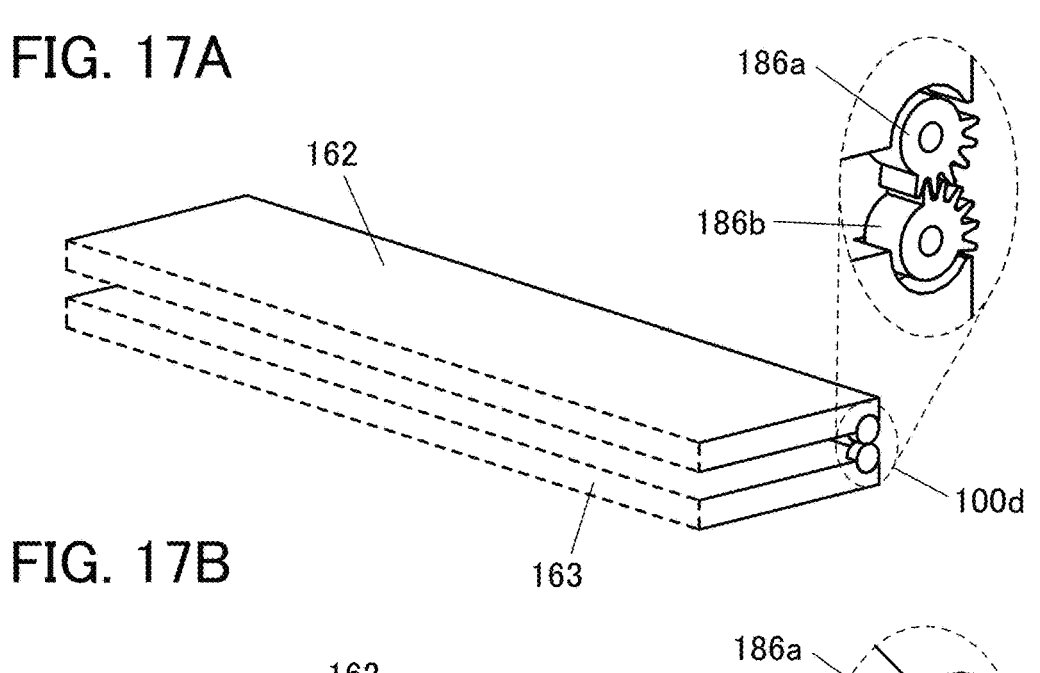
FIG. 17A to FIG. 17C are diagrams illustrating a support.
Figure 17B:
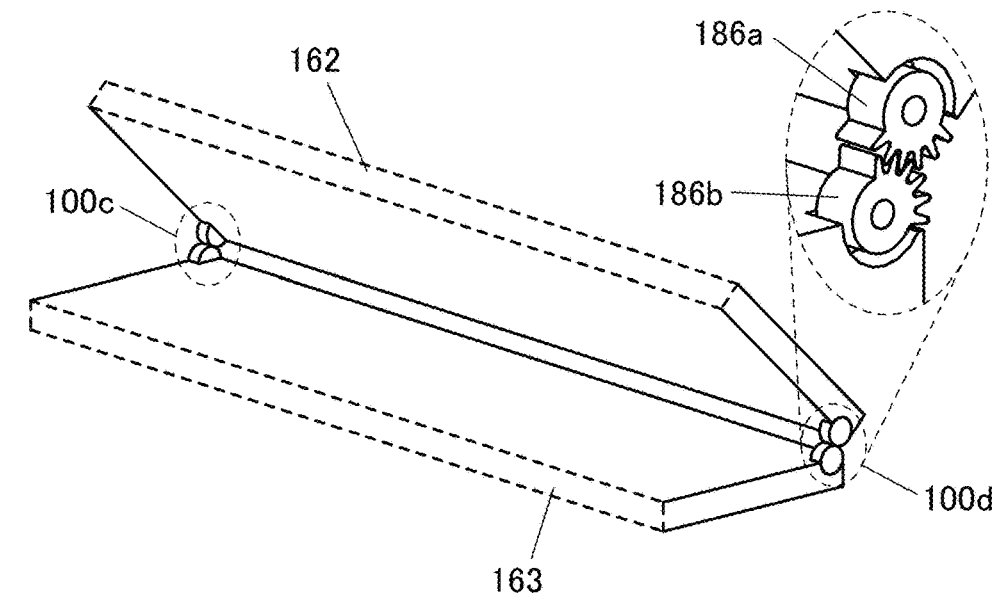
Figure 17C:
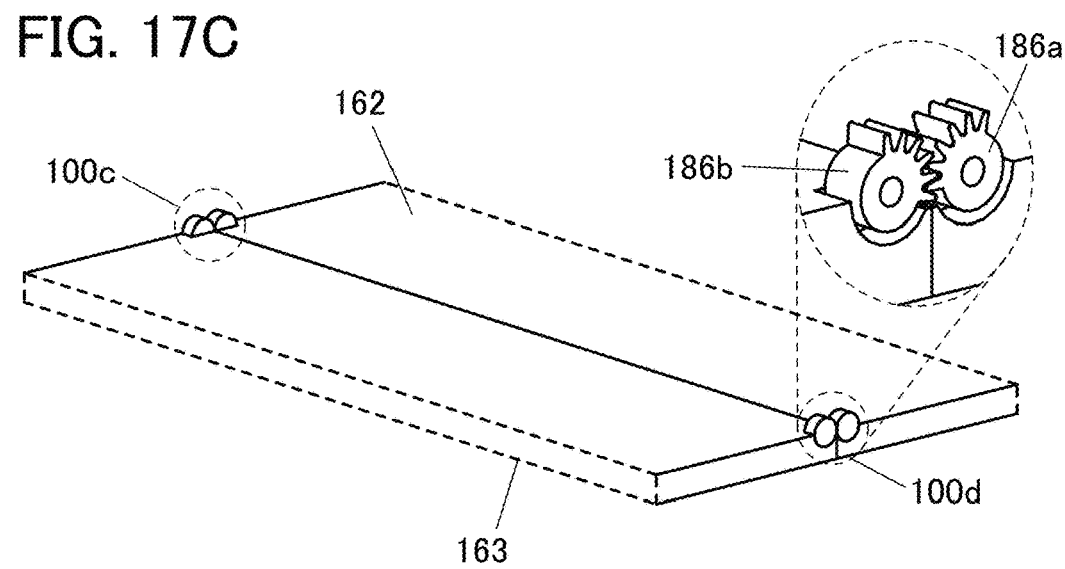

FIG. 17A to FIG. 17C illustrate another example of the angle adjustment devices 100c and 100d. Although the angle adjustment device 100d is described below, the angle adjustment device 100c has the same structure.

The angle adjustment device 100*d* includes a gear 186*a* and a gear 186*b*. The gear 186*a* is fixed to the flat-plate portion 162. The gear 186*b* is fixed to the flat-plate portion 163. The center axis of the gear 186*a* preferably overlaps with the first surface of the flat-plate portion 162. The center axis of the gear 186*b* preferably overlaps with the first surface of the flat-plate portion 163.

As illustrated in FIG. 17A, the gear 186*a* and the gear 186*b* are engaged with each other in a particular position in a folded state. Since the center axis of the gear 186*a* is on the first surface of the flat-plate portion 162 and the center axis of the gear 186*b* is on the first surface of the flat-plate portion 161 at this time, a gap is generated between the flat-plate portion 162 and the flat-plate portion 163 (between facing display surfaces of the display panel). Therefore, the flexible display panel can form a concave curved surface whose curvature radius is about the half of the gap.

When a transformation movement (opening movement) is made from the state of FIG. 17A, the flat-plate portion 162 and the flat-plate portion 163 are synchronized in accordance with engagement of the gear 186*a* and the gear 186*b*, and move to open with the angle adjustment device 100*d* as a pivot (see FIG. 17B). At this time, the curvature radius of the curved surface portion changes so as to be larger also in the display panel.

When the movement of transformation is further made from the state of FIG. 17B, as illustrated in FIG. 17C, the first surface of the flat-plate portion 162 and the first surface of the flat-plate portion 163 extend to be flat. At this time, the curved surface portion of the display panel also changes so as to be flat, and the entire display panel is set in an opened state so as to be flat. When a transformation movement is made in a reverse order of the above, the display panel can be folded.

Note that a mechanism for keeping the engagement between the gear 186*a* and the gear 186*b* may be provided. When the display panel is opened to be flat, the side surface of the flat-plate portion 162 and the side surface of the flat-plate portion 163 are in contact with each other. Accordingly, the angle adjustment device 100*d* does not cause bending in a reverse direction in the display panel, and a mechanism for inhibiting reverse bending may be unnecessary. Note that a spacer for keeping the gap between the flat-plate portion 162 and the flat-plate portion 163 at the time of folding may be provided. Alternatively, a mechanism for keeping the gap may be provided in the gear 186*a* and the gear 186*b*.

Application Example

Figure 18A:
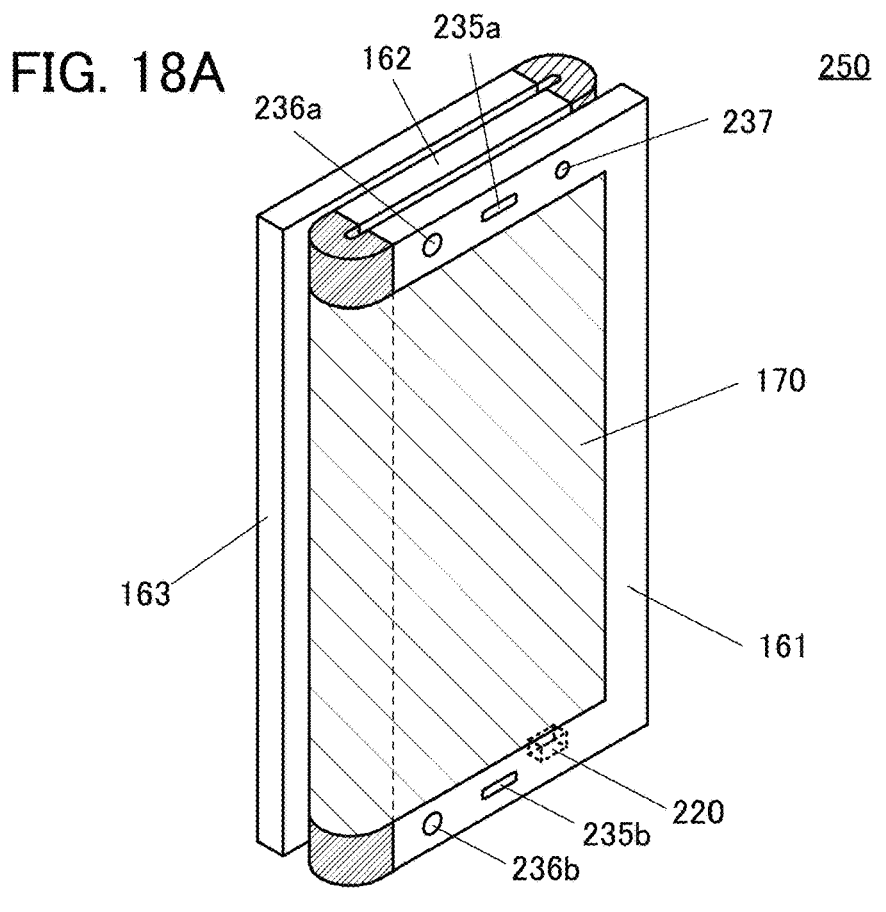
FIG. 18A and FIG. 18B are diagrams illustrating a display device.

FIG. 18 illustrates an example in which the flexible display device described in this embodiment is applied to an information terminal such as a smartphone. Note that components common to the display device are denoted by the same reference numerals. A display device 250 illustrated in FIG. 18A includes the display panel 170, audio input/output units 235*a* and 235*b*, cameras 236*a* and 236*b*, a sensor 237, and a sensor 220.

When one of the audio input/output units 235*a* and 235*b* functions as a microphone, the other of the audio input/output units 235*a* and 235*b* can function as a speaker. Therefore, when a telephone function is utilized, for example, it is possible to have a conversation without any inconvenience regardless of the side of the display a user holds. The microphone function and the speaker function can be switched with each other by the sensor 220 that senses a tilt. In addition, either the cameras 236*a* and 236*b* can similarly function with a high priority by the sensor 220.

The input/output units 235*a* and 235*b* may include both of a device that functions as a microphone and a device that functions as a speaker or may include one device that has both functions.

Alternatively, both the input/output units 235*a* and 235*b* can function as microphones to record stereo sound. Alternatively, both the input/output units 235*a* and 235*b* can function as speakers to reproduce stereo sound.

In addition, both the cameras 236*a* and 236*b* can function and can capture 3D images. The sensor 237 is an optical sensor and can adjust display luminance so that the images can be easily seen in accordance with ambient illuminance.

Figure 18B:
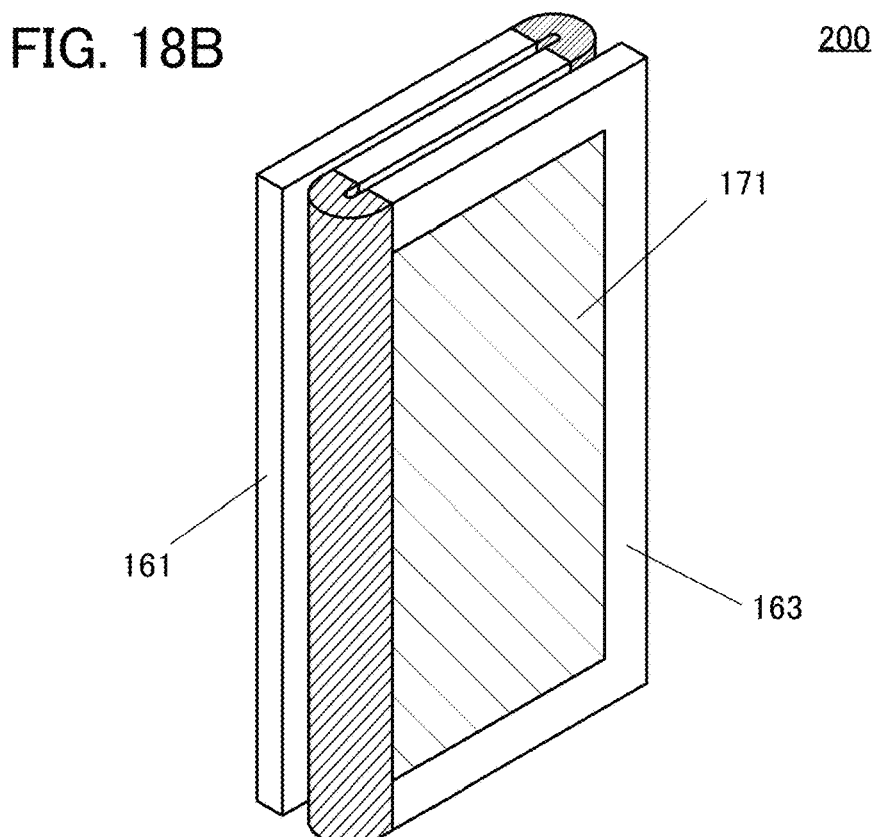

Moreover, as illustrated in FIG. 18B, a display panel 171 may be provided on a rear surface that is on a side opposite to a front surface of the display device 250 where the display panel 170 is provided. The display panel 171 can display the same image as the display panel 170. The display panel 171 can also be utilized as a sub-display that displays simple information, painting, a pattern, a picture, or the like; lighting; or the like. A display panel using a light-emitting device or a liquid crystal device can be used as the display panel 171, and low-power electronic paper or the like may be used as the display panel 171. A display panel using a hard substrate as a support can also be used as the display panel 171.

Note that as illustrated in FIG. 19A, the display panel 171 may be provided on the flat-plate portion 161, a display panel 172 may be provided on the flat-plate portion 162, and a display panel 173 may be provided on the flat-plate portion 163. Display panels equivalent to the display panel 171 can be used as the display panels 172 and 173.

Alternatively, as illustrated in FIG. 19B, a flexible display panel 175 may be provided on the rear surface of the display device 250. In that case, the display panel 175 can be bent, and thus the display panel 175 can be provided across the flat-plate portions 161 to 163, like the display panel 170 provided on the front surface.

Furthermore, as illustrated in FIG. 19C, a solar battery 240 may be provided on the rear surface of the display device 250. A battery in the display device 250 can be charged with power generated by the solar battery 240, and the power can be supplied to the outside through an external interface 245.

Note that FIG. 19C illustrates an example of a solar battery including a hard support. As the solar battery, for example, a silicon solar battery using crystalline silicon for a photoelectric conversion layer, a solar battery with a tandem structure of a silicon solar battery and a perovskite type solar battery, or the like can be used.

Alternatively, as illustrated in FIG. 19D, a solar cell in which a flexible substrate is used as a support may be used. As the solar battery, for example, a thin-film solar battery 141 such as an amorphous silicon solar battery, a CIGS (Cu—In—Ga—Se) type solar battery, an organic solar battery, or a perovskite type solar battery, or the like can be used. The solar battery using a flexible substrate as a support can be provided across the flat-plate portion 161 to 163, like the display panel 171.

Embodiment 2

In this embodiment, a structure example of a display panel that can be applied to the display device according to one embodiment of the present invention is described.

US 12,603,948 B2

17

Structure Example

Figure 20:
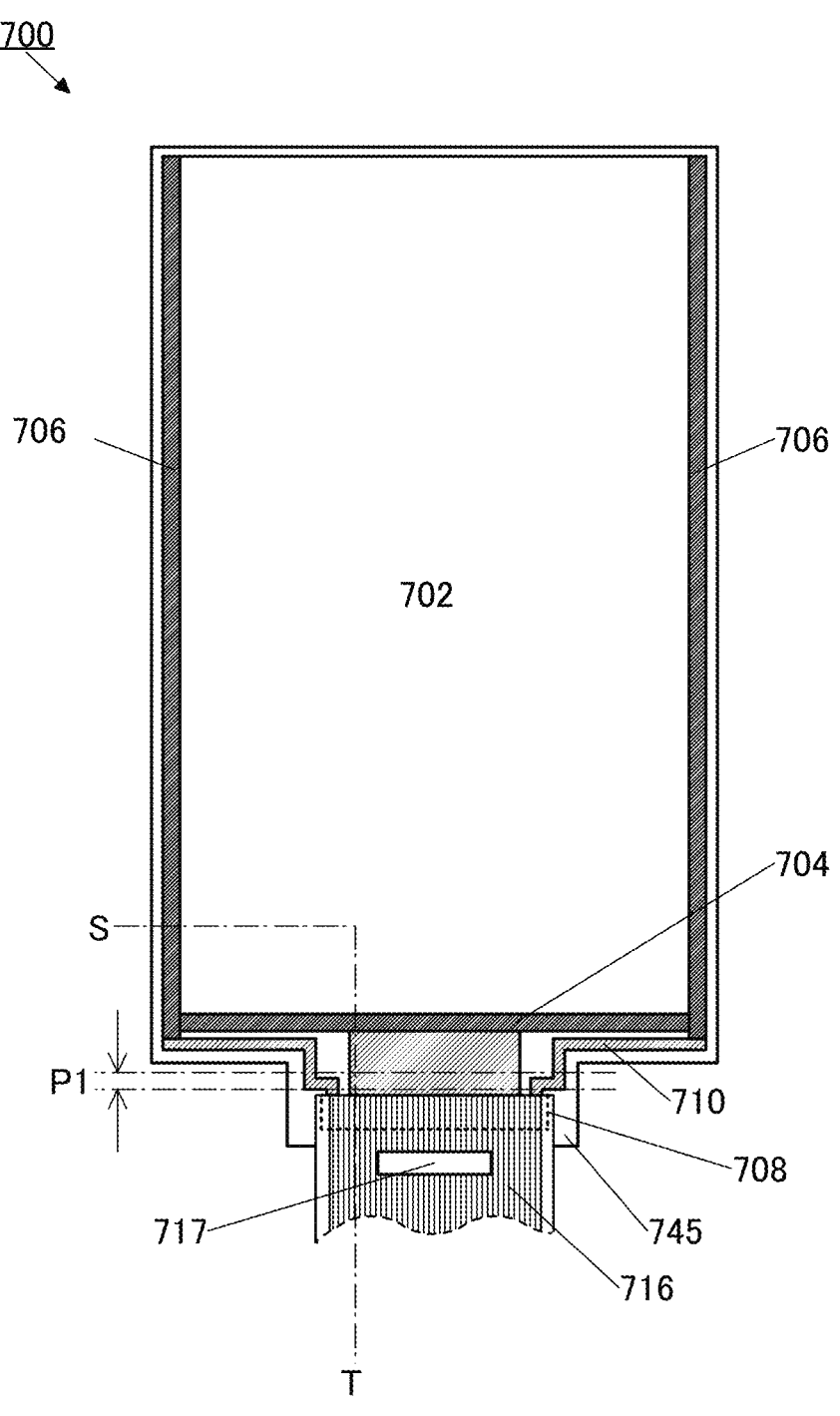
FIG. 20 is a diagram illustrating a structure example of a display panel.

FIG. 20 illustrates a top view of a display panel 700. The display panel 700 employs a flexible support substrate 745 and can be used as a flexible display. Furthermore, the display panel 700 includes a pixel portion 702 provided over the flexible support substrate 745. Furthermore, a source driver circuit portion 704, a pair of gate driver circuit portions 706, a wiring 710, and the like are provided over the support substrate 745. Moreover, a plurality of display devices are provided in the pixel portion 702.

In addition, part of the support substrate 745 is provided with an FPC (flexible printed circuit) terminal portion 708 to which an FPC 716 is connected. The pixel portion 702, the source driver circuit portion 704, and the gate driver circuit portions 706 are each supplied with a variety of signals and the like from the FPC 716 through the FPC terminal portion 708 and the wiring 710.

The pair of gate driver circuit portions 706 is provided on both sides with the pixel portion 702 sandwiched therebetween. Note that the gate driver circuit portions 706 and the source driver circuit portion 704 may be formed separately on semiconductor substrates or the like to form packaged IC chips. The IC chips can be mounted on the support substrate 745 by a COF (Chip On Film) technique or the like.

Transistors including an OS are preferably applied to transistors included in the pixel portion 702, the source driver circuit portion 704, and the gate driver circuit portions 706.

Light-emitting devices or the like can be used as the display devices in the pixel portion 702. Examples of light-emitting devices are self-luminous light-emitting devices such as an LED (Light Emitting Diode), an OLED (Organic LED), a QLED (Quantum-dot LED), a semiconductor laser, and the like. Alternatively, liquid crystal devices such as transmissive liquid crystal devices, reflective liquid crystal devices, or semi-transmissive liquid crystal devices can also be used as the display devices. Alternatively, shutter type or optical interference type MEMS (Micro Electro Mechanical Systems) devices; display devices employing a microcapsule method, an electrophoretic method, an electrowetting method, an Electronic Liquid Powder (registered trademark) method, or the like; and the like can also be used.

FIG. 20 illustrates an example where the support substrate 745 has a shape in which a portion provided with the FPC terminal portion 708 is projected. In a region P1 in FIG. 20, part of the support substrate 745 that includes the FPC terminal portion 708 can be bent backward. Bending the part of the support substrate 745 backward enables the FPC 716 to be placed in a state overlapping a rear side of the pixel portion 702 when the display panel 700 is mounted on an electronic device or the like, so that the electronic device or the like can be space-saving or small-sized.

An IC 717 is mounted on the FPC 716 connected to the display panel 700. The IC 717 has a function of a source driver circuit, for example. In that case, a structure can be employed in which the source driver circuit portion 704 in the display panel 700 includes at least one of a protection circuit, a buffer circuit, a demultiplexer circuit, and the like.

Cross-Sectional Structure Example

Structures using organic EL as the display device are described below using FIG. 21 and FIG. 22. Each of FIG. 21

Figure 22:
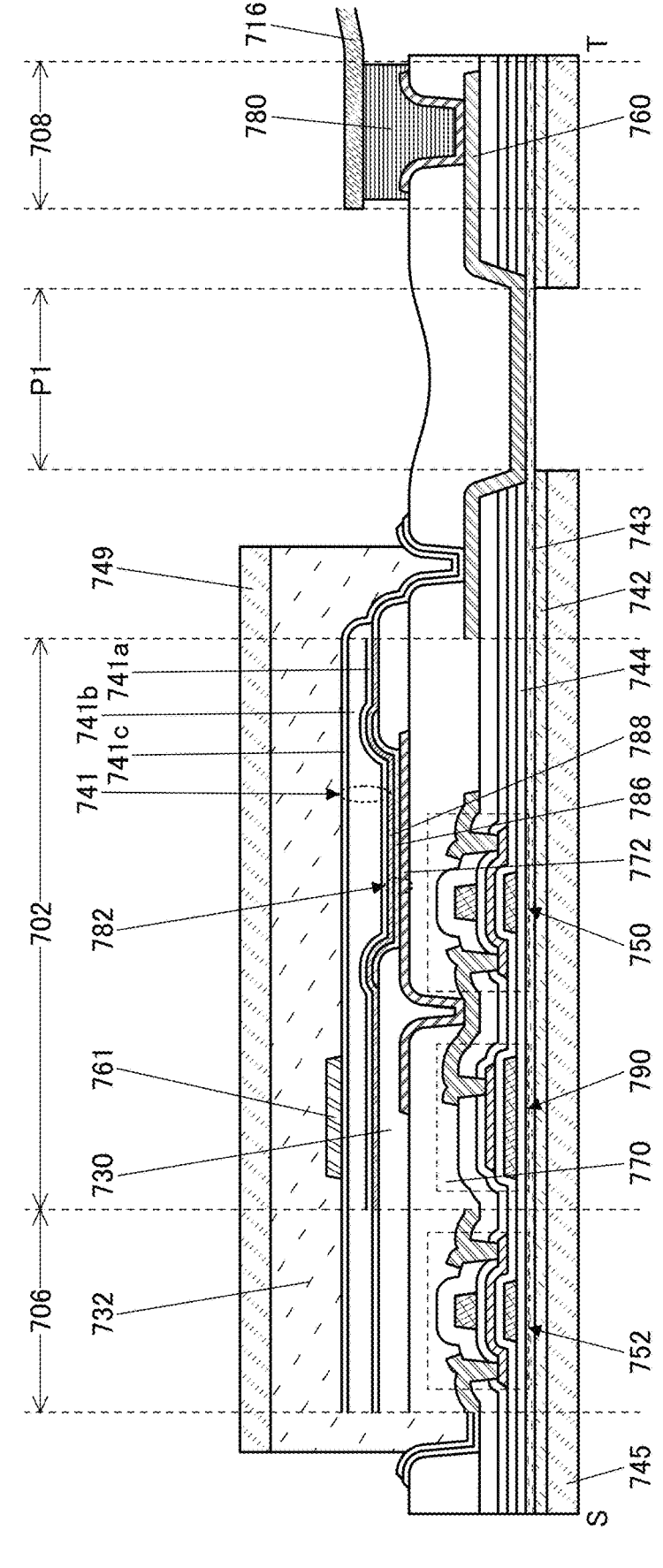
FIG. 22 is a diagram illustrating a structure example of a display panel.

18 and FIG. 22 is a schematic cross-sectional view of the display panel 700 illustrated in FIG. 20 along a dash-dot line S-T.

Figure 21:
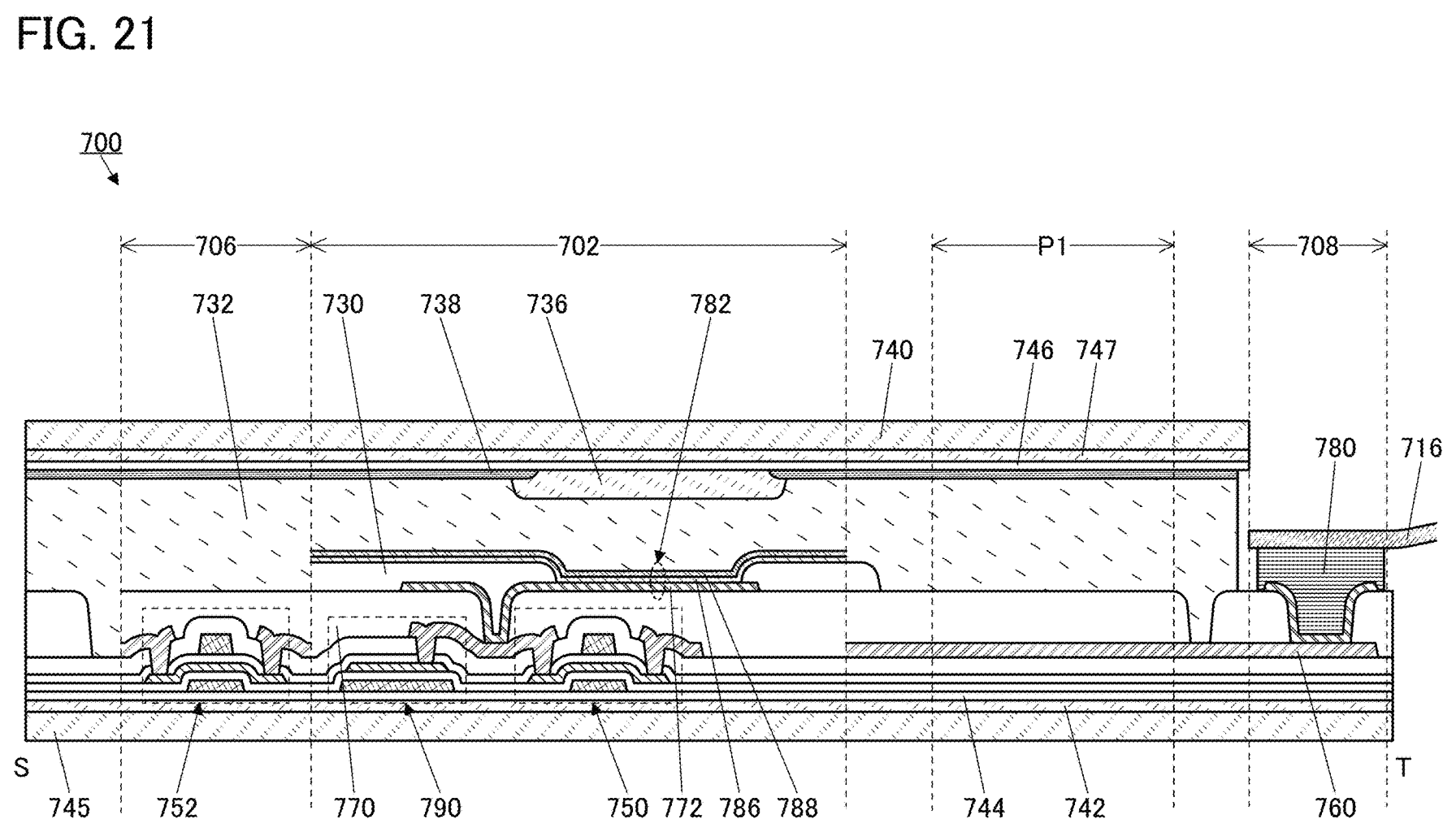

First, portions common to the display panels illustrated in FIG. 21 and FIG. 22 are described.

FIG. 21 and FIG. 22 illustrate cross sections including the pixel portion 702, the gate driver circuit portion 706, and the FPC terminal portion 708. The pixel portion 702 includes a transistor 750 and a capacitor 790. The gate driver circuit portion 706 includes a transistor 752

Each of the transistor 750 and the transistor 752 is a transistor in which an oxide semiconductor is employed for a semiconductor layer where a channel is formed. Note that the transistors are not limited thereto, and a transistor using silicon (amorphous silicon, polycrystalline silicon, or single-crystal silicon) or a transistor using an organic semiconductor for a semiconductor layer can be employed.

The transistor used in this embodiment includes a highly purified oxide semiconductor film in which formation of oxygen vacancies is suppressed. The transistor can have extremely low off-state current. Accordingly, in the pixel employing such a transistor, the retention time of an electric signal such as an image signal can be extended, and an interval between writings of an image signal or the like can also be set longer. Accordingly, the frequency of refresh operations can be reduced, so that power consumption can be reduced.

In addition, the transistor used in this embodiment can have comparatively high field-effect mobility and thus is capable of high-speed driving. For example, with such a transistor capable of high-speed driving used for the display panel, a switching transistor in a pixel portion and a driver transistor used in a driver circuit portion can be formed over the same substrate. In other words, a structure in which a driver circuit formed using a silicon wafer or the like is not employed is possible, and the number of components of the display device can be reduced. Furthermore, the use of the transistor capable of high-speed driving also in the pixel portion can provide a high-quality image.

The capacitor 790 includes a lower electrode formed by processing the same film as a film for a first gate electrode of the transistor 750 and an upper electrode formed by processing the same metal oxide film as a film for the semiconductor layer. The upper electrode has reduced resistance like a source region and a drain region of the transistor 750. In addition, part of an insulating film functioning as a first gate insulating layer of the transistor 750 is provided between the lower electrode and the upper electrode. That is, the capacitor 790 has a stacked-layer structure in which an insulating film functioning as a dielectric film is sandwiched between a pair of electrodes. Furthermore, a wiring obtained by processing the same film as a film for a source electrode and a drain electrode of the transistor 750 is connected to the upper electrode.

In addition, an insulating layer 770 that functions as a planarization film is provided over the transistor 750, the transistor 752, and the capacitor 790.

As the transistor 750 included in the pixel portion 702 and the transistor 752 included in the source driver circuit portion 704, transistors having different structures may be used. For example, a structure may be employed in which a top-gate transistor is used as one of the transistors 750 and 752 and a bottom-gate transistor is used as the other of the transistors 750 and 752. Note that the same applies to the source driver circuit portion 704, as in the gate driver circuit portion 706.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrode and the drain electrode of the transistor 750 or the like.

Next, the display panel 700 illustrated in FIG. 21 is described.

The display panel 700 illustrated in FIG. 21 includes the support substrate 745 and a support substrate 740. As each of the support substrate 745 and the support substrate 740, a glass substrate or a flexible substrate such as a plastic substrate can be used, for example.

The transistor 750, the transistor 752, the capacitor 790, and the like are provided over the insulating layer 744. The support substrate 745 and the insulating layer 744 are attached to each other with an adhesive layer 742.

The display panel 700 includes a light-emitting device 782, a coloring layer 736, a light-blocking layer 738, and the like.

The light-emitting device 782 includes a conductive layer 772, an EL layer 786, and a conductive layer 788. The conductive layer 772 is electrically connected to the source electrode or the drain electrode included in the transistor 750. The conductive layer 772 is provided over the insulating layer 770 and functions as a pixel electrode. In addition, an insulating layer 730 is provided to cover an end portion of the conductive layer 772. Over the insulating layer 730 and the conductive layer 772, the EL layer 786 and the conductive layer 788 are stacked and provided.

For the conductive layer 772, a material having a property of reflecting visible light can be used. For example, a material including aluminum, silver, or the like can be used. For the conductive layer 788, a material having a property of transmitting visible light can be used. For example, an oxide material including indium, zinc, tin, or the like is preferably used. Thus, the light-emitting device 782 is a top-emission light-emitting device that emits light to a side opposite a formation surface (a support substrate 740 side).

The EL layer 786 includes an organic compound or an inorganic compound such as quantum dots. The EL layer 786 includes a light-emitting material that exhibits blue light when current flows.

As the light-emitting material, a fluorescent material, a phosphorescent material, a thermally activated delayed fluorescence (TADF) material, an inorganic compound (a quantum dot material or the like), or the like can be used. Examples of materials that can be used for quantum dots include a colloidal quantum dot material, an alloyed quantum dot material, a core-shell quantum dot material, a core quantum dot material, and the like.

The light-blocking layer 738 and the coloring layer 736 are provided on one surface of an insulating layer 746. The coloring layer 736 is provided in a position overlapping the light-emitting device 782. In addition, the light-blocking layer 738 is provided in a region not overlapping the light-emitting device 782 in the pixel portion 702. Furthermore, the light-blocking layer 738 may also be provided to overlap the gate driver circuit portion 706 or the like.

The support substrate 740 is attached to the other surface of the insulating layer 746 with an adhesive layer 747. Furthermore, the support substrate 740 and the support substrate 745 are attached to each other with a sealing layer 732.

Here, for the EL layer 786 included in the light-emitting device 782, a light-emitting material that exhibits white light emission is employed. White light emission by the light-emitting device 782 is colored by the coloring layer 736 to be emitted to the outside. The EL layer 786 is provided over the pixels that exhibit different colors. The pixels provided with the coloring layer 736 transmitting any of red (R), green (G), and blue (B) are arranged in a matrix in the pixel portion 702, so that the display panel 700 can perform full-color display.

In addition, a conductive film having a transmitting property and a reflective property may be used for the conductive layer 788. In that case, a microcavity structure is achieved between the conductive layer 772 and the conductive layer 788 such that light of a specific wavelength can be intensified to be emitted. Also at this time, a structure may be employed in which an optical adjustment layer for adjusting an optical distance is placed between the conductive layer 772 and the conductive layer 788 such that the thickness of the optical adjustment layer differs between pixels of different colors and accordingly the color purity of light emitted from each pixel is increased.

Note that a structure in which the coloring layer 736 or the optical adjustment layer is not provided may be employed when the EL layer 786 is formed into an island shape for each pixel or into a stripe shape for each pixel column, i.e., the EL layer 786 is formed by separate coloring.

Here, an inorganic insulating film that functions as a barrier film having low permeability is preferably used for each of the insulating layer 744 and the insulating layer 746. With a structure in which the light-emitting device 782, the transistor 750, and the like are sandwiched between the insulating layer 744 and the insulating layer 746, degradation thereof can be inhibited and a highly reliable display panel can be achieved.

In a display panel 700A illustrated in FIG. 22, a resin layer 743 is provided between the adhesive layer 742 and the insulating layer 744 illustrated in FIG. 21. In addition, a protective layer 749 is provided instead of the support substrate 740.

The resin layer 743 is a layer including an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the adhesive layer 742. The resin layer 743 is preferably thinner than the support substrate 745.

The protective layer 749 is attached to the sealing layer 732. A glass substrate, a resin film, or the like can be used as the protective layer 749. Alternatively, as the protective layer 749, an optical member such as a polarizing plate (including a circularly polarizing plate) or a scattering plate, an input device such as a touch sensor panel, or a structure in which two or more of these are stacked may be employed.

The EL layer 786 included in the light-emitting device 782 is provided over the insulating layer 730 and the conductive layer 772 in an island shape. The EL layers 786 are formed separately so that respective subpixels emit light of different colors, so that color display can be performed without the use of the coloring layer 736.

A protective layer 741 is provided to cover the light-emitting device 782. The protective layer 741 has a function of preventing diffusion of impurities such as water into the light-emitting device 782. The protective layer 741 has a stacked-layer structure in which an insulating layer 741a, an insulating layer 741b, and an insulating layer 741c are stacked in this order from the conductive layer 788 side. In that case, it is preferable that inorganic insulating films with a high barrier property against impurities such as water be used as the insulating layer 741a and the insulating layer 741c and an organic insulating film that functions as a planarization film be used as the insulating layer 741b. Furthermore, the protective layer 741 is preferably provided to extend also to the gate driver circuit portion 706.

An organic insulating film covering the transistor 750, the transistor 752, and the like is preferably formed in an island shape inward from the sealing layer 732. In other words, an end portion of the organic insulating film is preferably inward from the sealing layer 732 or in a region overlapping an end portion of the sealing layer 732. FIG. 22 illustrates an example in which the insulating layer 770, the insulating layer 730, and the insulating layer 741b are processed into island shapes. The insulating layer 741c and the insulating layer 741a are provided in contact with each other in a portion overlapping the sealing layer 732, for example. Thus, when a structure is employed in which a surface of the organic insulating film covering the transistor 750 and the transistor 752 is not exposed to the outside of the sealing layer 732, diffusion of water or hydrogen from the outside to the transistor 750 and the transistor 752 through the organic insulating film can be favorably prevented. This can reduce variations in electrical characteristics of the transistors, so that a display device with extremely high reliability can be achieved.

In addition, in FIG. 22, the region P1 that can be bent includes a portion where the support substrate 745, the adhesive layer 742, and the inorganic insulating film such as the insulating layer 744 are not provided. Furthermore, the region P1 has a structure in which the insulating layer 770 including an organic material covers the wiring 760 so that the wiring 760 is not exposed. When a structure is employed in which an inorganic insulating film is not provided as long as possible in the region P1 that can be bent and only a conductive layer containing a metal or an alloy and a layer containing an organic material are stacked, generation of cracks caused at bending can be prevented. Moreover, when the support substrate 745 is not provided in the region P1, part of the display panel 700A can be bent with an extremely small curvature radius.

Furthermore, in FIG. 22, a conductive layer 761 is provided over the protective layer 741. The conductive layer 761 can be used as a wiring or an electrode.

In addition, in the case where a touch sensor is provided to overlap the display panel 700A, the conductive layer 761 can function as an electrostatic shielding film for preventing transmission of electrical noise to the touch sensor during pixel driving. In that case, a structure in which a predetermined constant potential is applied to the conductive layer 761 may be employed.

Alternatively, the conductive layer 761 can be used as an electrode of the touch sensor, for example. This enables the display panel 700A to function as a touch panel. For example, the conductive layer 761 can be used as an electrode or a wiring of a capacitive touch sensor. In that case, the conductive layer 761 can be used as a wiring or an electrode to which a sensor circuit is connected or a wiring or an electrode to which a sensor signal is input. When the touch sensor is formed over the light-emitting device 782 in this manner, the number of components can be reduced, and manufacturing cost of an electronic device or the like can be reduced.

The conductive layer 761 is preferably provided in a portion not overlapping the light-emitting device 782. The conductive layer 761 can be provided in a position overlapping the insulating layer 730, for example. Thus, a transparent conductive film with a comparatively low conductivity is not necessarily used for the conductive layer 761, and a metal or an alloy having high conductivity or the like can be used, so that the sensitivity of the sensor can be increased.

Note that as the type of the touch sensor that can be formed using the conductive layer 761, a variety of types such as a resistive type, a surface acoustic wave type, an infrared type, an optical type, and a pressure-sensitive type can be used, without limitation to a capacitive type. Alternatively, two or more of these may be combined and used.
<Components>
Components such as a transistor that can be employed in the display device will be described below.
[Transistor]
The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device according to one embodiment of the present invention. For example, a planar transistor, a staggered transistor, or an inverted staggered transistor may be used. In addition, a top-gate or bottom-gate transistor structure may be employed. Alternatively, gate electrodes may be provided above and below a channel.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. Typically, an oxide semiconductor containing indium, or the like can be used, and for example, a CAAC-OS, a CAC-OS, or the like described later can be used. A CAAC-OS has a crystal structure including stable atoms and is suitable for a transistor that puts emphasis on reliability, and the like. A CAC-OS exhibits excellent mobility characteristics and thus is suitable for a transistor that is driven at high speed, for example.

In an OS transistor, a semiconductor layer has a large energy gap, and thus the OS transistor can exhibit characteristics with an extremely low off-state current of several yoctoamperes per micrometer (a current value per micrometer of channel width). In addition, an OS transistor has features such that impact ionization, an avalanche breakdown, a short-channel effect, and the like do not occur, which are different from those of a Si transistor, and can form a highly reliable circuit. Furthermore, variations in electrical characteristics due to crystallinity unevenness, which are issues in Si transistors, are less likely to occur in OS transistors.

A semiconductor layer can be, for example, a film represented by an In-M-Zn-based oxide that contains indium, zinc, and an element M (M is one or more selected from metals such as aluminum, titanium, gallium, germanium, yttrium, zirconium, lanthanum, cerium, tin, neodymium, and hafnium). The In-M-Zn-based oxide can be formed by, for example, a sputtering method, an ALD (Atomic layer deposition) method, an MOCVD (Metal organic chemical vapor deposition) method, or the like.

In the case where an In-M-Zn-based oxide is deposited by a sputtering method, it is preferable that the atomic ratio of metal elements in a sputtering target satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements of the sputtering target in a range of ±40%.

A metal oxide film with a low carrier density is used as the semiconductor layer. For example, for the semiconductor layer, a metal oxide whose carrier density is lower than or equal to $1\times10^{17}/\text{cm}^3$, preferably lower than or equal to $1\times10^{15}/\text{cm}^3$, further preferably lower than or equal to $1\times10^{13}/\text{cm}^3$, still further preferably lower than or equal to $1\times10^{11}/\text{cm}^3$, even further preferably lower than $1\times10^{10}/\text{cm}^3$, and higher than or equal to $1\times10^{-9}/\text{cm}^3$ can be used. Such a metal oxide is referred to as a highly purified intrinsic or substantially highly purified intrinsic metal oxide. The oxide semiconductor has a low density of defect states and thus can be regarded as a metal oxide having stable characteristics.

Note that, without limitation to those described above, an oxide semiconductor with an appropriate composition may be used in accordance with required semiconductor characteristics and electrical characteristics (field-effect mobility, threshold voltage, and the like) of the transistor. In addition, to obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is one of Group 14 elements, is contained in the metal oxide contained in the semiconductor layer, oxygen vacancies are increased in the semiconductor layer, and the semiconductor layer becomes n-type. Thus, the concentration of silicon or carbon (concentration obtained by secondary ion mass spectrometry) in the semiconductor layer is set to lower than or equal to $2\times10^{18}$ atoms/cm³, preferably lower than or equal to $2\times10^{17}$ atoms/cm³.

Alkali metal and alkaline earth metal might generate carriers when bonded to a metal oxide, in which case the off-state current of the transistor might be increased. Thus, the concentration of alkali metal or alkaline earth metal in the semiconductor layer that is obtained by secondary ion mass spectrometry is set to lower than or equal to $1\times10^{18}$ atoms/cm³, preferably lower than or equal to $2\times10^{16}$ atoms/cm³.

When nitrogen is contained in the metal oxide contained in the semiconductor layer, electrons serving as carriers are generated and the carrier density increases, so that the semiconductor layer easily becomes n-type. As a result, a transistor using a metal oxide that contains nitrogen is likely to have normally-on characteristics. Accordingly, the nitrogen concentration in the semiconductor layer that is obtained by secondary ion mass spectrometry is preferably set to lower than or equal to $5\times10^{18}$ atoms/cm³.

In addition, when hydrogen is contained in an oxide semiconductor included in the semiconductor layer, hydrogen reacts with oxygen bonded to a metal atom to be water, and thus sometimes causes an oxygen vacancy in the oxide semiconductor. When a channel formation region in the oxide semiconductor includes oxygen vacancies, the transistor sometimes has normally-on characteristics. Furthermore, in some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set to lower than $1\times10^{20}$ atoms/cm³, preferably lower than $1\times10^{19}$ atoms/cm³, further preferably lower than $5\times10^{18}$ atoms/cm³, still further preferably lower than $1\times10^{18}$ atoms/cm³. When an oxide semiconductor with a sufficiently low concentration of impurities such as hydrogen is used for a channel formation region of a transistor, the transistor can have stable electrical characteristics.

In addition, oxide semiconductors (metal oxides) can be classified into a single crystal oxide semiconductor and a non-single-crystal oxide semiconductor. Examples of the non-single-crystal oxide semiconductors include a CAAC-OS (C-Axis-Aligned Crystalline Oxide Semiconductor), a polycrystalline oxide semiconductor, an nc-OS (nanocrystalline oxide semiconductor), an amorphous-like oxide semiconductor (a-like OS), an amorphous oxide semiconductor, and the like. Among non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

In addition, a CAC-OS (Cloud-Aligned Composite oxide semiconductor) may be used for a semiconductor layer of a transistor disclosed in one embodiment of the present invention.

Note that the non-single-crystal oxide semiconductor or CAC-OS can be suitably used for a semiconductor layer of a transistor disclosed in one embodiment of the present invention. In addition, as the non-single-crystal oxide semiconductor, the nc-OS or the CAAC-OS can be suitably used.

Note that in one embodiment of the present invention, a CAC-OS is preferably used for a semiconductor layer of a transistor. The use of the CAC-OS allows the transistor to have high electrical characteristics or high reliability.

Note that the semiconductor layer may be a mixed film including two or more kinds of a region of a CAAC-OS, a region of a polycrystalline oxide semiconductor, a region of an nc-OS, a region of an amorphous-like oxide semiconductor, and a region of an amorphous oxide semiconductor. The mixed film has, for example, a single-layer structure or a stacked-layer structure including two or more kinds of the above regions in some cases.

<Composition of CAC-OS>

The composition of a CAC (Cloud-Aligned Composite)—OS that can be used in a transistor disclosed in one embodiment of the present invention is described below.

The CAC-OS is, for example, a composition of a material in which elements that constitute a metal oxide are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that the metal oxide preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as $InO_{X1}$ (X1 is a real number greater than 0)) or indium zinc oxide (hereinafter referred to as $In_{X2}Zn_{Y2}O_{Z2}$ (each of X2, Y2, and Z2 is a real number greater than 0)) and gallium oxide (hereinafter referred to as $GaO_{X3}$ (X3 is a real number greater than 0)), gallium zinc oxide (hereinafter referred to as $Ga_{X4}Zn_{Y4}O_{Z4}$ (each of X4, Y4, and Z4 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite metal oxide having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In an electron diffraction pattern of the CAC-OS that is obtained by irradiation with an electron beam with a probe diameter of 1 nm (also referred to as a nanobeam electron beam), a ring-like region with high-luminance and a plurality of bright spots in the ring-like region are observed. It is therefore found from the electron diffraction pattern that the crystal structure of the CAC-OS includes an nc (nanocrystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of a metal oxide is exhibited. Accordingly, when the regions where $In_{X2}Zn_{Y2}O_{Z2}$ or $InO_{X1}$ is a main component are distributed like a cloud in a metal oxide, high field-effect mobility ($\mu$) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in a metal oxide, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current ($I_{on}$) and high field-effect mobility ($\mu$) can be achieved.

In addition, a semiconductor element using the CAC-OS has high reliability. Thus, the CAC-OS is suitable for a variety of semiconductor devices typified by a display.

Since a transistor including the CAC-OS in a semiconductor layer has high field-effect mobility and high drive capability, the use of the transistor in a driver circuit, a typical example of which is a scan line driver circuit that generates a gate signal, can provide a display device with a narrow bezel width (also referred to as a narrow bezel). Furthermore, with the use of the transistor in a signal line driver circuit that is included in a display device (particularly in a demultiplexer connected to an output terminal of a shift register included in a signal line driver circuit), a display device to which a small number of wirings are connected can be provided.

Furthermore, unlike a transistor including low-temperature polysilicon, the transistor including the CAC-OS in the semiconductor layer does not need a laser crystallization step. Thus, the manufacturing cost of a display device can be reduced even when the display device is formed using a large area substrate. In addition, the transistor including the CAC-OS in the semiconductor layer is preferably used for a driver circuit and a display portion in a large display device having high resolution such as ultra-high definition ("4K resolution," "4K2K," and "4K") or super high definition ("8K resolution," "8K4K," and "8K") because writing can be performed in a short time and display defects can be reduced.

Alternatively, silicon may be used for a semiconductor in which a channel of a transistor is formed. Although amorphous silicon may be used as silicon, silicon having crystallinity is particularly preferably used. For example, microcrystalline silicon, polycrystalline silicon, single crystal silicon, or the like is preferably used. In particular, polycrystalline silicon can be formed at a temperature lower than that for single crystal silicon and has higher field-effect mobility and higher reliability than amorphous silicon.

<Conductive Layer>

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. Alternatively, a single layer or a stacked-layer structure including a film containing these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. In addition, copper containing manganese is preferably used because controllability of a shape by etching is increased.

<Insulating Layer>

Examples of an insulating material that can be used for each insulating layer include, in addition to a resin such as acrylic or epoxy and a resin having a siloxane bond, an inorganic insulating material such as silicon oxide, silicon oxynitride, silicon nitride oxide, silicon nitride, or aluminum oxide.

The light-emitting device is preferably provided between a pair of insulating films with low water permeability. In that case, impurities such as water can be inhibited from entering the light-emitting device, and a decrease in the reliability of the device can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}[g/(m^2\cdot day)]$, preferably lower than or equal to $1\times10^{-6}$ $[g/(m^2\cdot day)]$, further preferably lower than or equal to $1\times10^{-7}[g/(m^2\cdot day)]$, still further preferably lower than or equal to $1\times10^{-8}$ $[g/(m^2\cdot day)]$.

The above is the description of the components.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, structure examples of a display device are described with reference to FIG. 23A, FIG. 23B, and FIG. 23C.

Figure 23A:
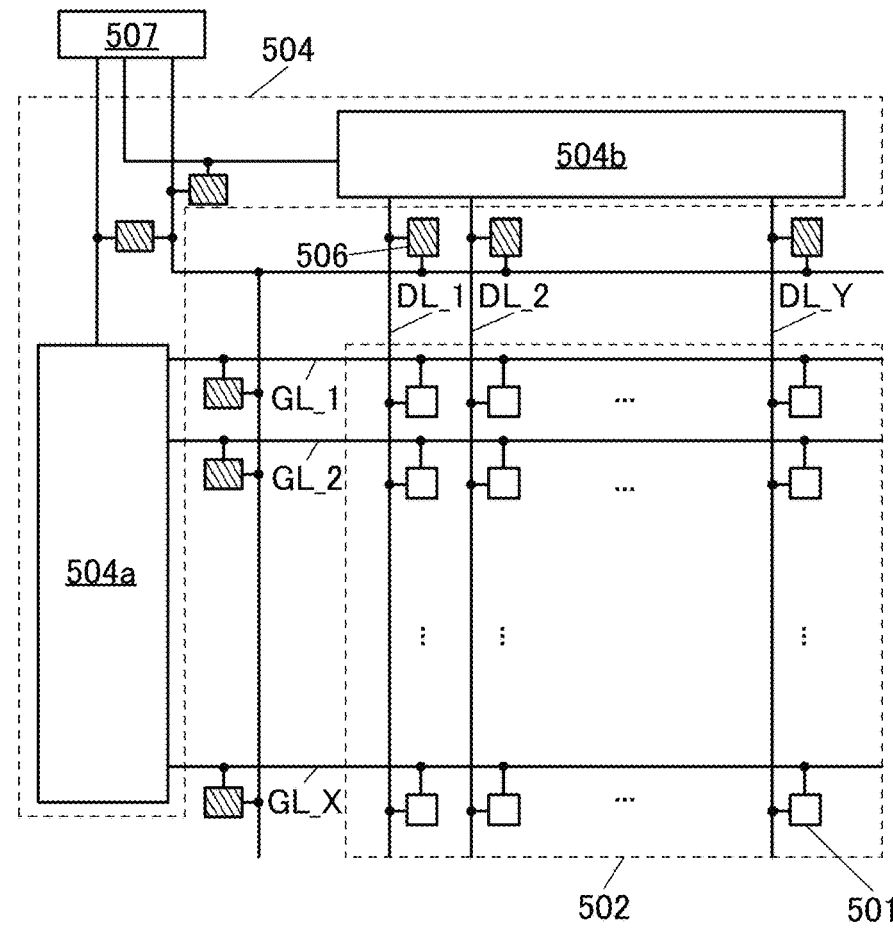
FIG. 23A is a block diagram of a display panel.
Figure 23A:
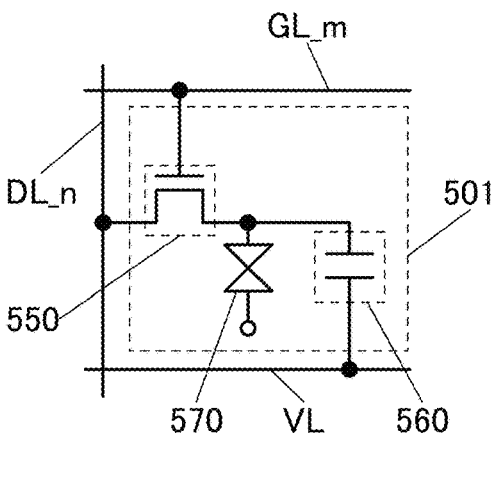
Figure 23A:
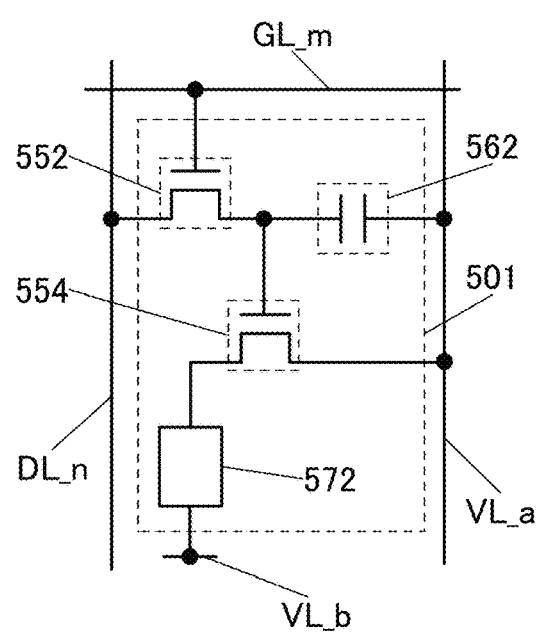

The display device illustrated in FIG. 23A includes a pixel portion 502, a driver circuit portion 504, protection circuits 506, and a terminal portion 507. Note that a structure in which the protection circuits 506 are not provided may be employed.

The pixel portion 502 includes a plurality of pixel circuits 501 that drive a plurality of display devices arranged in X rows and Y columns (X and Y each independently represent a natural number of 2 or more).

The driver circuit portion 504 includes driver circuits such as a gate driver 504a that outputs scan signals to gate lines GL_1 to GL_X and a source driver 504b that supplies data signals to data lines DL_1 to DL_Y. The gate driver 504a includes at least a shift register. In addition, the source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 23A is connected to a variety of wirings such as gate lines GL that are wirings between the gate driver 504a and the pixel circuits 501 and data lines DL that are wirings between the source driver 504b and the pixel circuits 501, for example. Note that the protection circuits 506 are hatched in FIG. 23A to distinguish the protection circuits 506 from the pixel circuits 501.

The gate driver 504a and the source driver 504b may each be provided over the same substrate as the pixel portion 502, or a substrate over which a gate driver circuit or a source driver circuit is separately formed (e.g., a driver circuit board formed using a single crystal semiconductor film or a polycrystalline semiconductor film) may be mounted on the substrate by COF, TCP (Tape Carrier Package), COG (Chip On Glass), or the like.

The plurality of pixel circuits 501 illustrated in FIG. 23A can have a structure illustrated in FIG. 23B or FIG. 23C, for example.

The pixel circuit 501 illustrated in FIG. 23B includes a liquid crystal device 570, a transistor 550, and a capacitor 560. In addition, the data line DL_n, the gate line GL_m, a potential supply line VL, and the like are connected to the pixel circuit 501.

The potential of one of a pair of electrodes of the liquid crystal device 570 is set as appropriate in accordance with the specifications of the pixel circuit 501. The alignment state of the liquid crystal device 570 is set depending on written data. Note that a common potential may be applied to one of the pair of electrodes of the liquid crystal device 570 included in each of the plurality of pixel circuits 501. Alternatively, a different potential may be applied to one of the pair of electrodes of the liquid crystal device 570 of the pixel circuit 501 in each row.

The pixel circuit 501 illustrated in FIG. 23C includes transistors 552 and 554, a capacitor 562, and a light-emitting device 572. Furthermore, the data line DL_n, the gate line GL_m, a potential supply line VL_a, a potential supply line VL_b, and the like are connected to the pixel circuit 501.

Note that a high power supply potential VDD is applied to one of the potential supply line VL_a and the potential supply line VL_b, and a low power supply potential VSS is applied to the other of the potential supply line VL_a and the potential supply line VL_b. Current flowing through the light-emitting device 572 is controlled in accordance with a potential applied to a gate of the transistor 554, so that the luminance of light emitted from the light-emitting device 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit will be described below.

<Circuit Structure>

FIG. 24A illustrates a circuit diagram of a pixel circuit 400. The pixel circuit 400 includes a transistor M1, a transistor M2, a capacitor C1, and a circuit 401. In addition, a wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display device. A variety of devices can be used as the display device, and typically, a light-emitting device such as an organic EL device or an LED device, a liquid crystal device, a MEMS (Micro Electro Mechanical Systems) device, or the like can be employed.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is set in an off state. In addition, the potential of the node N2 can be retained when the transistor M2 is set in an off state. Furthermore, when a predetermined potential is written to the node N1 through the transistor M1 with the transistor M2 being in an off state, the potential of the node N2 can be changed in accordance with displacement in the potential of the node N1 owing to capacitive coupling through the capacitor C1.

Here, the transistor employing an oxide semiconductor, which is illustrated in Embodiment 2, can be used as one or both of the transistor M1 and the transistor M2. Accordingly, owing to extremely low off-state current, the potentials of the node N1 and the node N2 can be retained over a long period. Note that in the case where the period in which the potential of each node is retained is short (specifically, the case where frame frequency is higher than or equal to 30 Hz, for example), a transistor employing a semiconductor such as silicon may be used.

Driving Method Example

Next, an example of a method for operating the pixel circuit 400 is described using FIG. 24B. FIG. 24B is a timing chart of the operation of the pixel circuit 400. Note that for simplification of the description, the influence of various kinds of resistance such as wiring resistance, parasitic capacitance of a transistor, a wiring, or the like, the threshold voltage of the transistor, and the like is not taken into account here.

In the operation shown in FIG. 24B, one frame period is divided into a period T1 and a period T2. The period T1 is a period in which a potential is written to the node N2, and the period T2 is a period in which a potential is written to the node N1.

In the period T1, a potential for setting the transistor in an on state is applied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is applied from the wiring S1 to the node N1 through the transistor M1. Furthermore, the first data potential $V_w$ is applied from the wiring S2 to the node N2 through the transistor M2. Accordingly, a potential difference $V_w$-$V_{ref}$ is retained in the capacitor C1.

Next, in the period T2, a potential for setting the transistor M1 in an on state is applied to the wiring G1, and a potential for setting the transistor M2 in an off state is applied to the wiring G2. In addition, a second data potential $V_{data}$ is supplied to the wiring S1. The wiring S2 may be supplied with a predetermined constant potential or brought into a floating state.

The second data potential $V_{data}$ is applied from the wiring S1 to the node N1 through the transistor M1. In that case, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as a positive value in FIG. 24B, the potential dV may be a negative value. That is, the second data potential $V_{data}$ may be lower than the potential $V_{ref}$.

Here, the potential dV is roughly determined by the capacitance value of the capacitor C1 and the capacitance value of the circuit 401. In the case where the capacitance value of the capacitor C1 is sufficiently larger than the capacitance value of the circuit 401, the potential dV is a potential close to the second data potential $V_{data}$.

As described above, a potential to be supplied to the circuit 401 including the display device can be generated by a combination of two kinds of data signals in the pixel circuit 400, so that gray levels can be corrected in the pixel circuit 400.

In addition, in the pixel circuit 400, it is also possible to generate a potential exceeding the maximum potential that can be supplied to the wiring S1 and the wiring S2. For example, in the case where a light-emitting device is used, high-dynamic range (HDR) display or the like can be performed. Furthermore, in the case where a liquid crystal device is used, overdriving or the like can be achieved.

Application Example

Example Using Liquid Crystal Device

A pixel circuit 400LC illustrated in FIG. 24C includes a circuit 401LC. The circuit 401LC includes a liquid crystal device LC and a capacitor C2.

In the liquid crystal device LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, high voltage can be supplied to the liquid crystal device LC; thus, high-speed display can be performed by overdriving or a liquid crystal material with high drive voltage can be employed, for example. In addition, gray levels can also be corrected in accordance with operating temperature, the degradation state of the liquid crystal device LC, or the like by supply of a correction signal to the wiring S1 or the wiring S2.

[Example Using Light-Emitting Device]

A pixel circuit 400EL illustrated in FIG. 24D includes a circuit 401EL. The circuit 401EL includes a light-emitting device EL, a transistor M3, and the capacitor C2.

In the transistor M3, a gate is connected to the node N2 and one electrode of the capacitor C2, one of a source and a drain is connected to a wiring supplied with a potential VH, and the other of the source and the drain is connected to one electrode of the light-emitting device EL. The other electrode of the capacitor C2 is connected to a wiring supplied with a potential $V_{com}$. The other electrode of the light-emitting device EL is connected to a wiring supplied with a potential $V_L$.

The transistor M3 has a function of controlling current to be supplied to the light-emitting device EL. The capacitor C2 functions as a storage capacitor. The capacitor C2 can be omitted when not needed.

Note that although a structure in which the anode side of the light-emitting device EL is connected to the transistor M3 is described here, the transistor M3 may be connected to the cathode side. In that case, the values of the potential VH and the potential $V_L$ can be changed as appropriate.

In the pixel circuit 400EL, a large amount of current can flow through the light-emitting device EL when a high potential is applied to the gate of the transistor M3, which enables HDR display or the like, for example. Moreover, a variation in electrical characteristics of the transistor M3 and the light-emitting device EL can also be corrected by supply of a correction signal to the wiring S1 or the wiring S2.

Note that the structure is not limited to the circuits illustrated in FIG. 24C and FIG. 24D, and a structure to which a transistor, a capacitor, and the like are further added may be employed.

At least part of this embodiment can be implemented in combination with the other embodiments described in this specification as appropriate.

Embodiment 5

In this embodiment, structure examples of a pixel of a display panel according to one embodiment of the present invention will be described below.

Structure examples of a pixel 300 are illustrated in FIG. 25A to FIG. 25E.

The pixel 300 includes a plurality of pixels 301. The plurality of pixels 301 each function as a subpixel. One pixel 300 is formed of the plurality of pixels 301 exhibiting different colors, and thus full-color display can be achieved in a display portion.

Figure 25A:
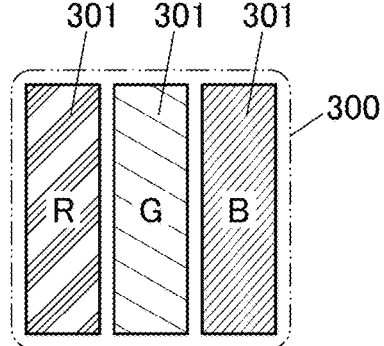
FIG. 25A to FIG. 25E are diagrams illustrating structure examples of a pixel.
Figure 25B:
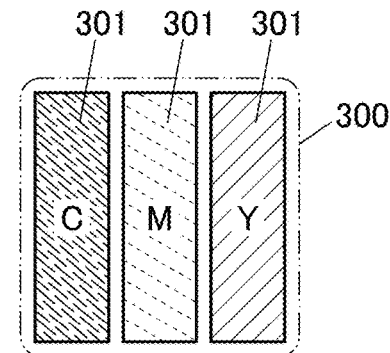

The pixels 300 illustrated in FIG. 25A and FIG. 25B each include three subpixels. The combination of colors exhibited by the pixels 301 included in the pixel 300 illustrated in FIG. 25A is red (R), green (G), and blue (B). The combination of colors exhibited by the pixels 301 included in the pixel 300 illustrated in FIG. 25B is cyan (C), magenta (M), and yellow (Y).

Figure 25C:
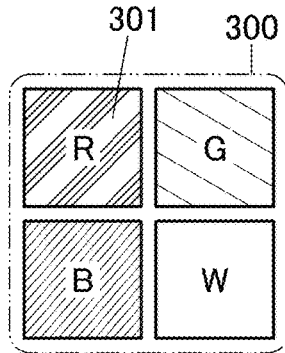
Figure 25D:
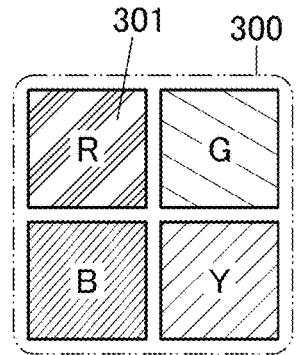
Figure 25E:
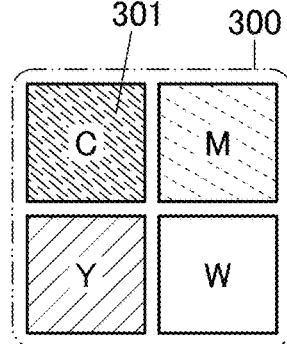

The pixels 300 illustrated in FIG. 25C to FIG. 25E each include four subpixels. The combination of colors exhibited by the pixels 301 included in the pixel 300 illustrated in FIG. 25C is red (R), green (G), blue (B), and white (W). The use of the subpixel that exhibits white can increase the luminance of the display portion. The combination of colors exhibited by the pixels 301 included in the pixel 300 illustrated in FIG. 25D is red (R), green (G), blue (B), and yellow (Y). The combination of colors exhibited by the pixels 301 included in the pixel 300 illustrated in FIG. 25E is cyan (C), magenta (M), yellow (Y), and white (W).

When subpixels that exhibit red, green, blue, cyan, magenta, yellow, and the like are combined as appropriate with more subpixels functioning as one pixel, the reproducibility of halftones can be increased. Thus, display quality can be increased.

The display device according to one embodiment of the present invention can reproduce the color gamut of various standards. For example, the display device according to one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display devices used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to as Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

In addition, by arranging the pixels 300 in a matrix of 1920×1080, a display device that can perform full-color display with a resolution of what is called full high definition (also referred to as "2K resolution," "2K1K," "2K," or the like) can be achieved. Alternatively, for example, by arranging the pixels 300 in a matrix of 3840×2160, a display device that can perform full-color display with a resolution of what is called ultra high definition (also referred to as "4K resolution," "4K2K," "4K," or the like) can be achieved. Alternatively, for example, by arranging the pixels 300 in a matrix of 7680×4320, a display device that can perform full-color display with a resolution of what is called super high definition (also referred to as "8K resolution," "8K4K," "8K," or the like) can be achieved. By increasing the number of pixels 300, a display device that can perform full-color display with 16K or 32K resolution can also be achieved.

At least part of this embodiment can be implemented in combination with the other embodiments described in this specification as appropriate.

REFERENCE NUMERALS

100: angle adjustment device, 100a: angle adjustment device, 100b: angle adjustment device, 100c: angle adjustment device, 100d: angle adjustment device, 101a: base component, 101b: base component, 102a: joining component, 102b: joining component, 103a: columnar component, 103b: columnar component, 104a: columnar component, 104b: columnar component, 105: columnar component, 111: surface, 112: surface, 113: surface, 114: surface, 115: surface, 121: opening portion, 122: portion, 122a: region, 122b: region, 122c: region, 131a: joining component, 131b: joining component, 132: spacer, 141: thin-film solar battery, 141a: opening portion, 141b: opening portion, 142a: opening portion, 142b: opening portion, 143a: opening portion, 143b: opening portion, 151: region, 151a: region, 151b: region, 152: region, 152a: region, 152b: region, 161: flat-plate portion, 162: flat-plate portion, 163: flat-plate portion, 165: bend portion, 166: columnar body, 167a: side surface, 167b: side surface, 167c: side surface, 167d: side surface, 170: display panel, 171: display panel, 172: display panel, 173: display panel, 175: display panel, 181: columnar body, 186a: gear, 186b: gear, 200: support, 220: sensor, 235a: input/output unit, 235b: input/output unit, 236a: camera, 236b: camera, 237: sensor, 240: solar battery, 245: external interface, 250: display device, 300: pixel, 301: pixel, 400: pixel circuit, 400EL: pixel circuit, 400LC: pixel circuit, 401: circuit, 401EL: circuit, 401LC: circuit, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal device, 572: light-emitting device, 700: display panel, 700A: display panel, 702: pixel portion, 704: source driver circuit portion, 706: gate driver circuit portion, 708: FPC terminal portion, 710: wiring, 716: FPC, 717: IC, 730: insulating layer, 732: sealing layer, 736: coloring layer, 738: light-blocking layer, 740: support substrate, 741: protective layer, 741a: insulating layer, 741b: insulating layer, 741c: insulating layer, 742: adhesive layer, 743: resin layer, 744: insulating layer, 745: support substrate, 746: insulating layer, 747: adhesive layer, 749: protective layer, 750: transistor, 752: transistor, 760: wiring, 761: conductive layer, 770: insulating layer, 772: conductive layer, 780: anisotropic conductive film, 782: light-emitting device, 786: EL layer, 788: conductive layer, 790: capacitor

The invention claimed is:

1. A display device comprising:

a display panel;

a first flat-plate portion;

a second flat-plate portion;

a first angle adjustment device; and a second angle adjustment device, wherein the display panel overlaps with the first flat-plate portion, the second flat-plate portion, and a bend portion provided between the first flat-plate portion and the second flat-plate portion, wherein the bend portion comprises a plurality of columnar bodies, wherein the first angle adjustment device comprises a first base component and a second base component, wherein the second angle adjustment device comprises a third base component and a fourth base component, wherein one end portion of a first columnar body of the plurality of columnar bodies in a longitudinal direction is joined to one of the first base component and the second base component, and wherein the other end portion of the first columnar body of the plurality of columnar bodies in the longitudinal direction is joined to one of the third base component and the fourth base component.

2. The display device according to claim 1, wherein a hinge comprises the bend portion, the first angle adjustment device, and the second angle adjustment device, wherein the first flat-plate portion is joined to one end portion of the hinge, and wherein the second flat-plate portion is joined to the other end portion of the hinge.

3. A display device comprising:

a display panel;

a first flat-plate portion;

a second flat-plate portion;

a first angle adjustment device;

a second angle adjustment device; and a first joining component, wherein the display panel overlaps with the first flat-plate portion, the second flat-plate portion, and a bend portion provided between the first flat-plate portion and the second flat-plate portion, wherein the bend portion comprises a plurality of columnar bodies, wherein the first angle adjustment device comprises a first base component and a second base component, wherein the second angle adjustment device comprises a third base component and a fourth base component, wherein one end portion of a first columnar body of the plurality of columnar bodies in a longitudinal direction is joined to one of the first base component and the second base component, wherein the other end portion of the first columnar body of the plurality of columnar bodies in the longitudinal direction is joined to one of the third base component and the fourth base component, wherein the first joining component comprises a first opening portion and a first notch portion, and wherein the first base component and the second base component are joined to each other via the first joining component.

4. The display device according to claim 3, wherein a hinge comprises the bend portion, the first angle adjustment device, and the second angle adjustment device, wherein the first flat-plate portion is joined to one end portion of the hinge, and wherein the second flat-plate portion is joined to the other end portion of the hinge.

5. The display device according to claim 3, wherein a first columnar component is provided in the first opening portion, wherein a second columnar component is provided in the first notch portion, wherein a third columnar component is provided in a second opening portion of a second joining component, and wherein a fourth columnar component is provided in a second notch portion of the second joining component.

6. A display device comprising:

a display panel;

a first flat-plate portion;

a second flat-plate portion;

a first angle adjustment device;

a second angle adjustment device;

a first joining component; and a second joining component, wherein the display panel overlaps with the first flat-plate portion, the second flat-plate portion, and a bend portion provided between the first flat-plate portion and the second flat-plate portion, wherein the bend portion comprises a plurality of columnar bodies, wherein the first angle adjustment device comprises a first base component and a second base component, wherein the second angle adjustment device comprises a third base component and a fourth base component, wherein one end portion of a first columnar body of the plurality of columnar bodies in a longitudinal direction is joined to one of the first base component and the second base component, wherein the other end portion of the first columnar body of the plurality of columnar bodies in the longitudinal direction is joined to one of the third base component and the fourth base component, wherein the first joining component comprises a first opening portion and a first notch portion, wherein the second joining component comprises a second opening portion and a second notch portion, and wherein the first base component and the second base component are joined to each other via the first joining component and the second joining component.

7. The display device according to claim 6, wherein a hinge comprises the bend portion, the first angle adjustment device, and the second angle adjustment device, wherein the first flat-plate portion is joined to one end portion of the hinge, and wherein the second flat-plate portion is joined to the other end portion of the hinge.

8. The display device according to claim 6, wherein a first columnar component is provided in the first opening portion, wherein a second columnar component is provided in the first notch portion, wherein a third columnar component is provided in the second opening portion, and wherein a fourth columnar component is provided in the second notch portion.

9. The display device according to claim 1, wherein the first base component and the second base component each comprise a first surface, a second surface, a third surface, a fourth surface, and a fifth surface, wherein the first surface has the same shape as the second surface, wherein the third surface has the same shape as the fourth surface, wherein the first surface is parallel to the second surface, wherein the third surface is adjacent to the first surface, wherein the fourth surface is adjacent to the second surface, wherein an angle formed by the third surface and the first surface is greater than 180° and less than or equal to 270°, wherein an angle formed by the fourth surface and the second surface is greater than 180° and less than or equal to 270°, wherein an angle formed by the third surface and the fourth surface is greater than 180° and less than 360°, and wherein the fifth surface is adjacent to each of the first surface to the fourth surface.

10. The display device according to claim 3, wherein the first base component and the second base component each comprise a first surface, a second surface, a third surface, a fourth surface, and a fifth surface, wherein the first surface has the same shape as the second surface, wherein the third surface has the same shape as the fourth surface, wherein the first surface is parallel to the second surface, wherein the third surface is adjacent to the first surface, wherein the fourth surface is adjacent to the second surface, wherein an angle formed by the third surface and the first surface is greater than 180° and less than or equal to 270°, wherein an angle formed by the fourth surface and the second surface is greater than 180° and less than or equal to 270°, wherein an angle formed by the third surface and the fourth surface is greater than 180° and less than 360°, and wherein the fifth surface is adjacent to each of the first surface to the fourth surface.

11. The display device according to claim 6, wherein the first base component and the second base component each comprise a first surface, a second surface, a third surface, a fourth surface, and a fifth surface, wherein the first surface has the same shape as the second surface, wherein the third surface has the same shape as the fourth surface, wherein the first surface is parallel to the second surface, wherein the third surface is adjacent to the first surface, wherein the fourth surface is adjacent to the second surface, wherein an angle formed by the third surface and the first surface is greater than 180° and less than or equal to 270°, wherein an angle formed by the fourth surface and the second surface is greater than 180° and less than or equal to 270°, wherein an angle formed by the third surface and the fourth surface is greater than 180° and less than 360°, and wherein the fifth surface is adjacent to each of the first surface to the fourth surface.

12. The display device according to claim 5, wherein major axes of the first columnar component, the second columnar component, the third columnar component, and the fourth columnar component are parallel to each other.

13. The display device according to claim 8, wherein major axes of the first columnar component, the second columnar component, the third columnar component, and the fourth columnar component are parallel to each other.

\* \* \* \* \*